(12) United States Patent
Kurihara

(10) Patent No.: US 10,026,624 B2
(45) Date of Patent: Jul. 17, 2018

(54) CONDUCTOR COMPOSITION INK, LAMINATED WIRING MEMBER, SEMICONDUCTOR ELEMENT AND ELECTRONIC DEVICE, AND METHOD FOR PRODUCING LAMINATED WIRING MEMBER

(71) Applicant: IDEMITSU KOSAN CO., LTD., Tokyo (JP)

(72) Inventor: Naoki Kurihara, Chiba (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 15/537,477

(22) PCT Filed: Dec. 17, 2015

(86) PCT No.: PCT/JP2015/085392
§ 371 (c)(1),
(2) Date: Jun. 19, 2017

(87) PCT Pub. No.: WO2016/098860
PCT Pub. Date: Jun. 23, 2016

(65) Prior Publication Data
US 2017/0358461 A1    Dec. 14, 2017

(30) Foreign Application Priority Data
Dec. 19, 2014    (JP) .................................. 2014-257542

(51) Int. Cl.
*H05K 3/10*    (2006.01)
*H01L 21/48*   (2006.01)
(Continued)

(52) U.S. Cl.
CPC ............. *H01L 21/486* (2013.01); *H05K 3/10* (2013.01); *H05K 3/4069* (2013.01); *H05K 3/4647* (2013.01)

(58) Field of Classification Search
None
See application file for complete search history.

(56) References Cited

U.S. PATENT DOCUMENTS

| 5,480,839 A | 1/1996 | Ezawa |
| 2005/0037614 A1 | 2/2005 | Fukuchi |

(Continued)

FOREIGN PATENT DOCUMENTS

| CN | 1126369 A | 7/1996 |
| CN | 1581447 A | 2/2005 |

(Continued)

OTHER PUBLICATIONS

Machine translation, Lee, Korean Pat. Pub. No. KR 10-2011-0111174, translation date: Apr. 10, 2018, Espacenet, all pages.*

(Continued)

*Primary Examiner* — Victoria K Hall
(74) *Attorney, Agent, or Firm* — Millen White Zelano and Branigan, PC; John Sopp

(57) ABSTRACT

A conductor of the invention is in a form of a conductive convex portion in a laminated wiring member and includes a conductive material and a liquid repellent, in which the conductive material is in a form of metal particles, the liquid repellent is a fluorine-containing compound adapted to form a self-assembled monomolecular film. The conductor has a surface energy in a range from more than 30 mN/m to 80 mN/m. The conductor of the invention is exemplified by the conductive convex portion in the laminated wiring member and functions as a VIA post in the laminated wiring member.

21 Claims, 9 Drawing Sheets

(51) Int. Cl.
*H05K 3/40* (2006.01)
*H05K 3/46* (2006.01)

(56) References Cited

U.S. PATENT DOCUMENTS

| | | | |
|---|---|---|---|
| 2010/0181104 A1 | | 7/2010 | Hotta |
| 2011/0143119 A1 | * | 6/2011 | Bell ..................... B22F 1/0062 428/221 |
| 2011/0159207 A1 | | 6/2011 | Kamakura |
| 2011/0209907 A1 | | 9/2011 | Lee |
| 2015/0253591 A1 | * | 9/2015 | Kato ..................... G02B 26/005 359/290 |
| 2017/0130085 A1 | * | 5/2017 | Kondo .................. C09D 11/52 |

FOREIGN PATENT DOCUMENTS

| | | | | |
|---|---|---|---|---|
| CN | 101849448 A | | 9/2010 | |
| CN | 102137550 A | | 7/2011 | |
| JP | 6-216258 A | | 8/1994 | |
| JP | 2002-164635 A | | 6/2002 | |
| JP | 2005-101552 A | | 4/2005 | |
| JP | 2006-245238 A | | 9/2006 | |
| JP | 2006-295116 A | | 10/2006 | |
| JP | 2008-108857 A | | 5/2008 | |
| JP | 2010-126602 | * | 6/2010 | ............ C09D 11/00 |
| JP | 2012-186455 A | | 9/2012 | |
| JP | 2013120624 A | | 6/2013 | |
| KR | 2009022605 A | | 3/2009 | |
| KR | 10-2011-0111174 | * | 10/2011 | ............... B05D 1/18 |
| WO | 2010/010609 A1 | | 1/2010 | |

OTHER PUBLICATIONS

Machine translation, Fukuda, Japanese Pat. Pub. No. JP 2010-126602, translation date: Apr. 10, 2018, Espacenet, all pages.*
M. Choi et al, Effect of Surface Treatment on the Performance of TIPS Pentacene TFT by Inkjet Printing, Society for Information Display International Symposium, Digest of Technical Papers, May 2010, vol. 41, Issue 1, pp. 1180-1183.*
Y. Takeda et al., Integrated circuits using fully solution-processed organic TFT devices with printed silver electrodes, Organic Electronics, Dec. 2013, vol. 14, Issue 12, pp. 3362-3370.*
S. Norita et al., Inkjet-printed copper electrodes using photonic sintering and their application to organic thin-film transistors, Organic Electronics, Oct. 2015, vol. 25, pp. 131-134.*
International Search Report corresponding to International application No. PCT/JP2015/085392—dated Mar. 8, 2016.
Espacenet Bibliographic data: JP2002164635 (A)—Jun. 7, 2002 (English Abstract).
Espacenet Bibliographic data: JP2005101552 (A)—Apr. 14, 2005 (English Abstract).
Espacenet Bibliographic data: JP2006245238 (A)—Sep. 14, 2006 (English Abstract).
Espacenet Bibliographic data: JP2006295116 (A)—Oct. 26, 2006 (English Abstract).
Espacenet Bibliographic data: JP2008108857 (A)—May 8, 2008 (English Abstract).
Espacenet Bibliographic data: JP2012186455 (A)—Sep. 27, 2012 (English Abstract).
Espacenet Bibliographic data: JPH06216258 (A)—Aug. 5, 1994 (English Abstract).
Espacenet Bibliographic data: WO2010010609 (A1)—Jan. 28, 2010 (English Abstract).
English Translation of International Preliminary Report on Patentability for PCT/JP2015/085392 dated Jun. 20, 2017.

* cited by examiner

CONDUCTOR COMPOSITION INK, LAMINATED WIRING MEMBER, SEMICONDUCTOR ELEMENT AND ELECTRONIC DEVICE, AND METHOD FOR PRODUCING LAMINATED WIRING MEMBER

TECHNICAL FIELD

The present invention relates to a conductor composition ink, a laminated wiring member, a semiconductor device and electronic equipment, and a manufacturing method of the laminated wiring member.

BACKGROUND ART

A laminated wiring member in which an insulation layer containing a resin is interposed between two electrodes is used in various devices such as a semiconductor device (e.g., a semiconductor transistor), a capacitance touch panel sensor, and a printed board (e.g., a flexible printed board (FPC)). Such a laminated wiring member typically has a structure in which a contact hole is formed in the insulation layer and both the electrodes are connected in the contact hole.

As a formation method of the insulation layer provided with the contact hole, a method of removing a part of an insulation film formed entirely over a board by means of photolithography and etching is typically used. Particularly, in an organic thin-film transistor provided by using an organic semiconductor for a semiconductor layer of a semiconductor transistor, since the semiconductor layer often exhibits a poor tolerance against an organic solvent, an insulation film is required as a passivation layer on an upper side of the semiconductor layer. Moreover, particularly when a low-molecular organic semiconductor such as pentacene is used, the semiconductor layer exhibits a poor tolerance against the organic solvent. As the passivation layer in such a case, use of a fluorinated insulation film typified by CYTOP has been studied. However, since an ink used for fluorinated insulation film has a small surface tension, it is difficult to perform a patterning by ink jet printing (IJ), plate printing or the like. Accordingly, after forming the fluorinated insulation film entirely over the board by spin coating or the like, it is required to employ a method of removing a part of the fluorinated insulation film by photolithography, etching or the like.

In order to solve the above problem, for instance, Patent Literature 1 discloses a through-hole formation method including: disposing a core material on a conductive layer; laminating a film over the core material; and removing a part of the film corresponding to or around the core material to make a hole. Patent Literature 2 discloses a contact hole formation method including: forming a removable pillar on a base material; forming an insulation layer on a side of the base material where the pillar is formed; and removing the pillar to make a contact hole in the insulation layer.

However, these methods require a removing step of the core material or the pillar and it may happen that a residue of the core material and the pillar disadvantageously remains in the contact hole. Moreover, since an electrostatic suction-type liquid drop discharge method is used for forming the pillar in the method of Patent Literature 2, it takes time for the step, so that productivity is adversely affected.

Patent Literature 3 discloses a method of forming a VIA post, and subsequently forming an interlayer insulation film by using a screen plate having a non-discharge region slightly larger than a head of the VIA post. However, it is difficult to form a minute VIA post since screen printing is used. Moreover, a material of the interlayer insulation film is limited to a material to which screen printing is applicable.

Patent Literature 4 discloses a method of forming a VIA directly on a wiring pattern provided on a board by inkjet printing in such a shape that ends of the VIA project beyond a middle portion thereof. However, since a projecting periphery of a conductive portion is used in this method, an available conductive area is diminished as the formed conductive portion becomes small. Moreover, it is difficult to completely reproduce the shape of the VIA with respect to all the VIAs.

CITATION LIST

Patent Literature(s)

Patent Literature 1: JP2006-245238A
Patent Literature 2: JP2012-186455A
Patent Literature 3: JP2006-295116A
Patent Literature 4: JP2008-108857A

SUMMARY OF THE INVENTION

Problem(s) to be Solved by the Invention

An object of the invention is to provide a manufacturing method of a laminated wiring member, the method capable of forming a VIA post of an insulation layer in a simple way, and to provide a conductor composition ink, a laminated wiring member, a semiconductor device and electronic equipment.

Means for Solving the Problems

According to an aspect of the invention, a laminated wiring member includes: a wiring member including a base material and a first electrode formed on the base material; a conductor in a form of a conductive convex portion including a conductive material and a liquid repellent, the conductive convex portion being in electrical continuity with the first electrode, functioning as a VIA post, and having a surface energy from more than 30 mN/m to 80 mN/m, in which the conductive material is in a form of metal particles, and the liquid repellent is a fluorine-containing compound adapted to form a self-assembled monomolecular film; an insulation layer formed of a resin composition and in which the conductive convex portion is present; and a second electrode in electrical continuity with the conductive convex portion and formed on the insulation layer, in which a height of the conductive convex portion is larger than a thickness of the insulation layer, and at least a part of the conductive convex portion projecting from the insulation layer is in electrical continuity with the second electrode.

According to another aspect of the invention, a manufacturing method of a laminated wiring member includes: a first step comprising: preparing a wiring member including a base material and a first electrode formed on the base material; applying a conductor composition ink including a conductive material, a liquid repellent and a solvent on the first electrode; and burning the conductor composition ink to form a conductor in a form of a conductive convex portion being in electrical continuity with the first electrode, having liquid repellency, functioning as a VIA post, and having a surface energy from more than 30 mN/m to 80 mN/m, in which the conductive material is in a form of metal particles, the liquid repellent is a fluorine-containing compound adapted to form a self-assembled monomolecular film; a second step of forming a coating film of a resin composition on the wiring member where the conductive convex portion is formed and curing the coating film, thereby forming an insulation layer including the conductive convex portion so that a height of the conductive convex portion is larger than a thickness of the insulation layer; and a third step of forming a second electrode on the insulation layer so that the second electrode is in electrical continuity with at least a part of the conductive convex portion projecting from the insulation layer.

According to still another aspect of the invention, a conductor composition ink used in the manufacturing method of the laminated wiring member according to the above aspect of the invention includes a conductive material, a liquid repellent and a solvent, in which the conductive material is in a form of metal particles, the liquid repellent is a fluorine-containing thiol compound adapted to form a self-assembled monomolecular film, and a surface energy of a solidified film obtained by heating the conductor composition ink at 180 degrees C. for 30 minutes is in a range from more than 30 mN/m to 80 mN/m.

According to a further aspect of the invention, a semiconductor device includes the laminated wiring member according to the above aspect of the invention, in which the first electrode is a source electrode, a drain electrode or an intermediate electrode, and the second electrode is a gate electrode, an intermediate electrode or an external input/output electrode.

According to a still further aspect of the invention, electronic equipment includes the laminated wiring member according to the above aspect of the invention.

According to the above aspects of the invention, the manufacturing method of the laminated wiring member, the method capable of forming the VIA post of the insulation layer in a simple way, can be provided and the conductor composition ink, a laminated wiring member, the semiconductor device and electronic equipment can be provided.

DESCRIPTION OF EMBODIMENTS

Figure 1A:
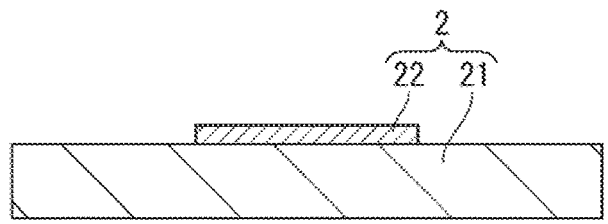
FIG. 1A illustrates a step of a manufacturing method of a laminated wiring member in an exemplary embodiment.

A suitable exemplary embodiment of the invention will be described in detail below with reference to the attached drawings and the like. It should be noted that a shape and the like of each of components are exaggeratedly shown in the drawings for easily understanding a content of the invention.

Since the exemplary embodiment to be described below is a specific suitable example of the invention, various technically suitable limitations are given to the exemplary embodiment. However, the scope of the invention is not limited to the exemplary embodiment in the following description unless it is particularly described that the invention is limited to the exemplary embodiment.

Manufacturing Method of Laminated Wiring Member

Firstly, a manufacturing method of a laminated wiring member in the exemplary embodiment of the invention will be described.

The manufacturing method of the laminated wiring member in the exemplary embodiment includes a first step (i.e., a conductive convex portion forming step), a second step (i.e., an insulation layer forming step), and a third step (i.e., a second electrode forming step).

FIGS. 1A to 1E illustrate steps of the manufacturing method of the laminated wiring member in the exemplary embodiment.

Figure 1B:
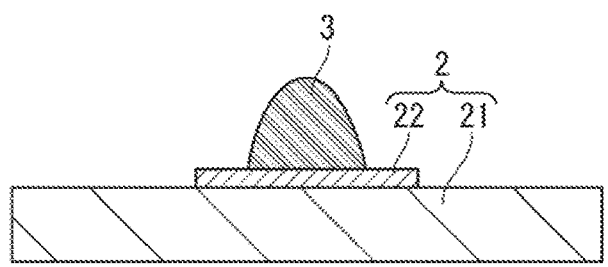
FIG. 1B illustrates another step of the manufacturing method of the laminated wiring member in the exemplary embodiment.
Figure 1C:
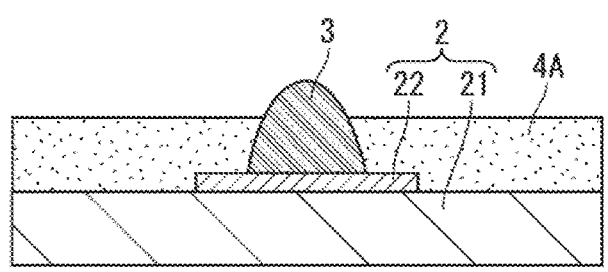
FIG. 1C illustrates still another step of the manufacturing method of the laminated wiring member in the exemplary embodiment.
Figure 1D:
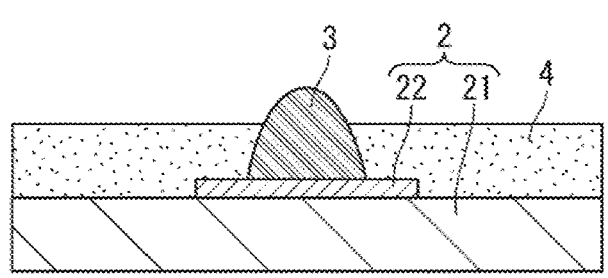
FIG. 1D illustrates a further step of the manufacturing method of the laminated wiring member in the exemplary embodiment.
Figure 1E:
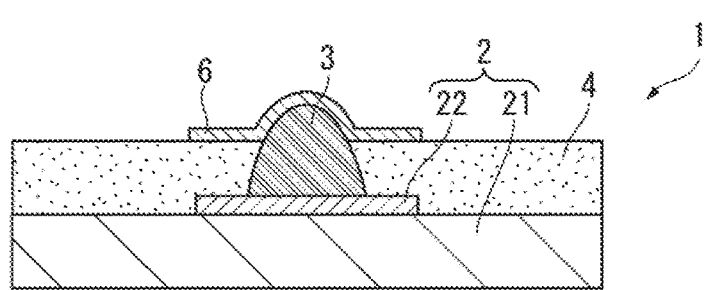
FIG. 1E illustrates a still further step of the manufacturing method of the laminated wiring member in the exemplary embodiment.

In the manufacturing method of the laminated wiring member in the exemplary embodiment, firstly, a wiring member 2 including a base material 21 and a first electrode 22 formed on the base material 21 is prepared as shown in FIG. 1A. Next, a conductor composition ink containing a conductive material, a liquid repellent and a solvent is applied in a pattern on the first electrode 22 and burned, thereby forming a liquid-repellent conductive convex portion 3 in electrical continuity with the first electrode 22 is formed as shown in FIG. 1B (the conductive convex portion forming step). Subsequently, as shown in FIG. 1C, a coating film 4A of a resin composition is formed over the wiring member 2 on which the conductive convex portion 3 is formed. Subsequently, the coating film 4A formed of the resin composition is cured, thereby forming an insulation layer 4 on a part of the wiring member 2 except for the conductive convex portion 3 while the conductive convex portion 3 functions as a VIA post, as shown in FIG. 1D (the insulation layer forming step). Subsequently, as shown in FIG. 1E, a second electrode 6 is formed on the insulation layer 4 so as to establish electrical continuity with the conductive convex portion 3 functioning as the VIA post (the second electrode forming step). Thus, the laminated wiring member 1 can be manufactured.

According to the exemplary embodiment, since the conductive convex portion forming step for forming the liquid-repellent conductive convex portion 3 and the insulation layer forming step for forming the insulation layer 4 are provided, the insulation layer having the VIA post can be formed in a simple way.

More specifically, in the exemplary embodiment, since the liquid-repellent conductive convex portion 3 can be formed in the conductive convex portion forming step, when a resin composition is applied on the wiring member 2 in the insulation layer forming step, the resin composition can be repelled from a surface of the conductive convex portion 3. Accordingly, the coating film 4A of the resin composition can be formed without covering the conductive convex portion 3. By curing the coating film 4A, the insulation layer 4 having the conductive convex portion 3 functioning as the VIA post can be formed.

Consequently, in the exemplary embodiment, the insulation layer 4 having the VIA post can be formed in a simpler method than a conventional method using photolithography or the like.

It has been studied to use, for instance, a screen printing for printing an insulation layer having a contact hole in order to form the insulation layer having a VIA post in a small number of steps. However, it is difficult to form a thin-film insulation layer and a minute contact hole.

Examples of the method of applying the resin composition in a pattern further include an ink jet printing and a gravure offset printing. However, a favorable patterning cannot be conducted when a surface tension of the resin composition is small.

In contrast, in the exemplary embodiment, the patterning is not required for the coating film 4A of the resin composition and the resin composition can be applied entirely over the wiring member 2, so that a favorably flat insulation layer 4 can be formed.

First Step: Conductive Convex Portion Forming Step

In the conductive convex portion forming step, the wiring member 2 including the base material 21 and the first electrode 22 formed on the base material 21 is prepared as shown in FIG. 1A. The conductor composition ink containing the conductive material, the liquid repellent and the solvent is applied in a pattern on the first electrode 22 and burned, thereby forming a liquid-repellent conductive convex portion 3 in electrical continuity with the first electrode 22 (see FIG. 1B).

Wiring Member

The wiring member 2 includes the base material 21 and the first electrode 22.

The base material 21 supports the first electrode 22. Moreover, the base material 21 is usually heat resistant. Heat resistance level of the base material 21 is not particularly limited as long as deformation is not caused by heating in the steps of manufacturing the laminated wiring member.

The base material 21 is not particularly limited as long as having a self-supporting capability. The base material 21 having any functions depending on usage of the laminated wiring member 1 manufactured in the exemplary embodiment is usable.

Examples of the base material 21 includes: a rigid base material having no flexibility such as a glass base material; and a flexible base material having flexibility such as a film formed of a plastic resin. Examples of the plastic resin include polyethylene terephthalate (PET), polyethylene naphthalate (PEN), polyethersulfone (PES), polyimide (PI), polyether etherketone (PEEK), polycarbonate (PC), polyphenylene sulfide (PPS) and polyetherimide (PEI).

The base material 21 may be provided in a single layer or a laminate. When the base material 21 is provided in a laminate, for instance, the laminate may include a flat layer containing a curable resin and formed on the base material 21. Moreover, the laminate may include a barrier layer formed on the base material 21.

When the base material 21 is transparent, a light transmittance of the base material 21 in a visible light region is preferably 80% or more. Herein, the light transmittance can be measured according to JIS K7361-1 (a testing method of a total light transmittance of a plastic-transparent material).

The first electrode 22 is formed on the base material 21. It is only required that the first electrode 22 is formed on the base material 21. The first electrode 22 may be formed directly on the base material 21, or alternatively, may be formed on the base material 21 with other layer(s) interposed therebetween. It should be noted that, in the following description, a surface of the wiring member 2 where the first electrode 22 is formed is sometimes referred to as a surface of the wiring member 2 where the insulation layer is formed.

The first electrode 22 is typically formed in a pattern on the base material 21. A planar shape of the first electrode 22 can be appropriately selected depending on a type of the laminated wiring member 1 manufactured by the manufacturing method according to the exemplary embodiment. Examples of the planar shape of the first electrode 22 include a linear shape and a pad shape used for an electrode pad.

A material of the first electrode 22 is not particularly limited as long as it has a desired electrical conductivity. Examples of the material include: a metal material such as Ta, Ti, Al, Zr, Cr, Nb, Hf, Mo, Au, Ag, Pt, Cu, Mo—Ta alloy, Ag alloy, Cu alloy, and Al alloy; an inorganic conductive material such as a transparent inorganic conductive material such as ITO (indium tin oxide) and IZO (indium zinc oxide); and an organic conductive material such as PEDOT/PSS (polyethylene dioxythiophene/polystyrene sulfonic acid). Moreover, a conductive paste containing conductive fine particles is also usable as the material. As for the conductive fine particles, later-described conductive fine particles used for the conductor composition ink are appropriately selected in use. Other components used for the conductive paste may be the same as generally used ones. For instance, a later-described solvent, any component(s) and the like used in the conductor composition ink are appropriately selected in use.

A thickness of the first electrode 22 is not particularly limited as long as it has a desired electrical conductivity. For instance, the thickness is preferably in a range from 30 nm to 5000 nm, more preferably in a range from 50 nm to 2000 nm, particularly preferably in a range from 200 nm to 2000 nm.

When the thickness of the first electrode 22 is excessively large, a level difference formed by the first electrode 22 becomes large, so that it may be difficult to favorably form the insulation layer. When the thickness of the first electrode 22 is excessively small, it may be difficult for the first electrode 22 to exhibit a favorable electrical conductivity.

In the exemplary embodiment, the "thickness" means a thickness obtained by a general measurement method. Examples of the measurement method of the thickness include: a method using a stylus in which the thickness is calculated by tracing a surface with the stylus to detect unevenness; a method of measuring an observation image using a transmission electron microscope (TEM), a scanning electron microscope (SEM) and the like; and an optical method of calculating the thickness based on a reflection spectrum. It should be noted that an average of thicknesses measured at a plurality of points on a target may be used as the thickness.

A surface wettability of the first electrode 22 is not particularly limited as long as a desired conductive convex portion can be formed by applying or printing the conductor composition ink in a pattern. The surface wettability of the first electrode 22 is, for instance, represented by a contact angle formed between the surface of the first electrode 22 and water. The contact angle is preferably in a range from 1 degree to 95 degrees, more preferably in a range from 1 degree to 90 degrees, particularly preferably in a range from 20 degrees to 90 degrees.

This is because the wettability of the surface of the first electrode 22 cannot be differentiated from the liquid repellency of the later-formed conductive convex portion 3 when the contact angle is excessively large. When the contact angle is excessively small, the conductor composition ink easily spreads over, so that the conductive convex portion 3 is possibly formed on another electrode adjacent to the first electrode 22 to cause a faulty electrical continuity.

The "contact angle with water" means a contact angle with water at 25 degrees C.

For instance, the contact angle in the exemplary embodiment can be measured by dropping a liquid of one microliter on a measurement target, observing a shape of a droplet of the dropped liquid from a lateral side, and measuring an angle formed between the droplet and the measurement target. In the exemplary embodiment, the contact angle can be measured, for instance, using a contact angle measurement device manufactured by IMOTO MACHINERY CO., LTD. Alternatively, in the exemplary embodiment, the contact angle can be measured, for instance, using a contact angle meter manufactured by Kyowa Interface Science Co., Ltd.

A forming method of the first electrode 22 may be the same as a general electrode forming method. Specifically, after a conductive layer is formed entirely over the base material 21, the conductive layer is etched into a predetermined pattern with photolithography. Examples of a method of forming the conductive layer entirely over the base material 21 includes: a PVD method such as vacuum deposition, sputtering and ion plating; and a CVD method.

The forming method of the first electrode 22 may be a printing method using a conductive paste. Examples of the printing method include an ink jet printing, screen printing, gravure offset printing, and reverse offset printing.

In the exemplary embodiment, the forming method of the first electrode 22 is preferably a printing method. This is because a surface wettability of the conductive layer formed by the printing method is easily adjustable and a shape of the conductive convex portion 3 is easily controllable compared with a conductive layer formed by vapor deposition.

The wiring member 2 is not particularly limited as long as it has the base material 21 and the first electrode 22 described above. A necessary component may be appropriately selected and added to the wiring member 2. For instance, the wiring member 2 may include: an electrode used for a wiring member (hereinafter, referred to as a wiring-member electrode) (not shown) formed on the base material 21; and an insulation layer used for a wiring member (hereinafter, referred to as a wiring-member insulation layer) (not shown) formed in a manner to cover the wiring-member electrode. In this case, the first electrode 22 is formed on the wiring-member insulation layer. Moreover, an electrode other than the first electrode 22 may be formed coplanar with the first electrode 22.

A planar shape of each of the wiring-member electrode and the electrode other than the first electrode 22 can be appropriately selected depending on a type and the like of the laminated wiring member 1 manufactured by the manufacturing method according to the exemplary embodiment. A material, thickness and forming method of each of the wiring-member electrode and the electrode other than the first electrode 22 are the same as those of the first electrode 22. Accordingly, the description of the material, thickness and forming method is omitted herein.

A material of the wiring-member insulation layer is not particularly limited as long as it has insulation performance. Examples of the material include an organic material such as an acrylic resin, a phenolic resin, fluorine resin, epoxy resin, cardo resin, vinyl resin, imido resin and novolac resin; and an inorganic material such as $SiO_2$, SiNx and $Al_2O_3$. A single kind of the material of the wiring-member insulation layer may be used, or two or more kinds of the material thereof may be used. It should be noted that a resin composition used in a later-described insulation layer forming step is usable as the material of the wiring-member insulation layer.

A thickness of the wiring-member insulation layer can be appropriately selected depending on usage and the like of the laminated wiring member 1 manufactured in the exemplary embodiment.

A method of forming the wiring-member insulation layer is exemplified by a later-described method of forming the insulation layer 4. When the wiring-member insulation layer is formed of the inorganic material, for instance, a CVD method is applicable.

Conductor Composition Ink

The conductor composition ink used in this step includes a conductive material, a liquid repellent and a solvent.

The conductive material contributes to expression of conductivity of the conductive convex portion 3. The conductive material is capable of giving a desired conductivity to the conductive convex portion 3 and is specifically exemplified by metal particles.

The conductive material may be in a form of nanocolloids in which the metal particles are dispersed in the solvent.

Examples of metal species of the metal particles include silver, copper, mercury, tin, indium, nickel, palladium, platinum, and gold. One of the examples may be used alone or two or more thereof may be used in combination. Among the examples, silver is particularly preferable in terms of compatibility with the above liquid repellent.

The metal particles preferably have a mean particle size in a range from 10 nm to 1000 nm. Moreover, a metallic nano-wire having a diameter of 50 nm or less may be included. The mean particle size of the metal particles can be measured by observation using a transmission electron microscope (TEM). Specifically, a measurement method of the particle size includes measuring projected area circle-equivalent diameters of all the particles (about 50 pieces) in a field of view, and calculating an average of the obtained diameters.

The conductive material preferably has a content in a range from 15 mass % to 75 mass % of a total amount of the conductor composition ink, more preferably in a range from 20 mass % to 50 mass %. When the content of the conductive material falls within the above range, the conductive convex portion can be more efficiently formed.

The liquid repellent gives liquid repellency to the conductive convex portion 3. The liquid repellent is specifically exemplified by a fluorine-containing thiol compound adapted to form a self-assembled monomolecular film.

When the metal particles are used as the conductive material, the fluorine-containing thiol compound adapted to form the self-assembled monomolecular film can give liquid repellency to the metal particles while keeping conductivity. As a result, the conductive convex portion obtained by using the conductor composition ink can exhibit both of conductivity and liquid repellency.

The liquid repellent is not limited to the fluorine-containing thiol compound as long as it is a composition containing fluorine (i.e., a fluorine-containing compound). The fluorine-containing compound is exemplified by a fluorine-containing disulfide compound.

Examples of the fluorine-containing thiol compound adapted to form a self-assembled monomolecular film include a fluorine-containing thiol compound having an aromatic ring and alkanethiol having a fluorinated moiety. Among the above examples, at least one compound selected from the group consisting of a fluorine-containing thiol compound having an aromatic ring (preferably a benzene ring) and 6 to 20 carbon atoms is preferable in terms of surface modification of the metal particles.

Specific examples of the fluorine-containing thiol compound having an aromatic ring and 6 to 20 carbon atoms include trifluoromethylbenzenethiol (e.g., 4-trifluoromethylbenzenethiol and 3-trifluoromethylbenzenethiol), pentafluorobenzenethiol, 2,3,5,6-tetrafluorobenzenethiol, 2,3,5,6-tetrafluoro-4-(trifluoromethyl)benzenethiol, 2,3,5,6-tetrafluoro-4-mercapto benzoic acid methylester, 3,5-bistrifluoromethylbenzenethiol, 4-fluorobenzenethiol, and 11-(2,3,4,5,6-pentafluorobenzyloxy)-1-undecanethiol.

Among the above examples, trifluoromethylbenzenethiol and 2,3,5,6-tetrafluoro-4-(trifluoromethyl)benzenethiol are particularly preferable in terms of liquid repellency.

Examples of the fluorine-containing disulfide compound include a fluorine-containing disulfide compound having an aromatic ring and a disulfide compound having a carbon chain having a fluorinated moiety. The fluorine-containing disulfide compound having the aromatic ring is specifically exemplified by a compound obtained by dimerizing the above fluorine-containing thiol compound, and is particularly preferably a compound obtained by dimerizing trifluoromethylbenzenethiol or 2,3,5,6-tetrafluoro-4-(trifluoromethyl)benzenethiol in terms of the liquid repellency.

The liquid repellent preferably has a content of 10 mass % or less of the total amount of the conductor composition ink, more preferably 5 mass % or less. When the content of the liquid repellent is equal to or less than the upper limit value, dispersion performance of the conductive material in the conductor composition ink is not hampered. Moreover, the lower limit value of the liquid repellent is preferably 0.1 mass % or more in terms of liquid repellency of the conductive convex portion obtained by using the conductor composition ink.

The solvent disperses or dissolves the conductive material and the liquid repellent.

Examples of the solvent include water, an alcohol solvent (e.g., monoalcohol solvent, diol solvent, and polyhydric alcohol solvent), hydrocarbon solvent, ketone solvent, ester solvent, ether solvent, glyme solvent, and halogen solvent. One of the examples may be used alone or two or more thereof may be used in combination. Among the examples, the alcohol solvent is preferable in terms of printability. Examples of the alcohol solvent include isopropyl alcohol, hexanol, heptanol, octanol, nonanol, decanol, undecanol, dodecanol, tridecanol, tetradecanol, pentadecanol, hexadecanol, cyclohexanol, and 1-methoxy-2-propanol. Examples of the ketone solvent include cyclohexanone and methylisobutylketone.

The solvent preferably has a surface tension at 25 degrees C. in a range from 40 mN/m to 65 mN/m. When the surface tension of the solvent falls within the above range, the conductor composition ink can be sufficiently attached to a base. The surface tension can be measured by a pendant drop method.

Examples of the alcohol solvent having the surface tension at 25 degrees C. in a range from 40 mN/m to 65 mN/m include ethylene glycol, glycerin and 1,3-propanediol. Among the examples, 1,3-propanediol is particularly preferable.

The solvent preferably has a content in a range from 25 mass % to 85 mass % of the total amount of the conductor composition ink, more preferably in a range from 50 mass % to 80 mass %. When the content of the solvent falls within the above range, the conductor composition ink can be suitably applied.

The conductor composition ink according to the exemplary embodiment may include any desired component in addition to the above-described components.

The any desired component is exemplified by a dispersant.

The any desired component preferably has a content of 10 mass % or less of the total amount of the conductor composition ink.

In the conductor composition ink according to the exemplary embodiment, a surface energy of a solidified film needs to range from more than 30 mN/m to 80 mN/m, in which the solidified film is obtained by forming a film of the conductor composition ink on a glass substrate by spin coating and burning the film at 180 degrees C. for 30 minutes.

It should be noted that the surface energy refers to a value obtained by Kitazaki and Hata analyzing a value of the measured contact angle with respect to each of the solvents by using a geometric mean method based on an extended Fowkes (written by Yasuaki Kitazaki, Toshio Hata et. al, Magazine of Adhesion Society of Japan, Vol. 8 (3), pp. 131-141 (1972)).

Adjustment of the surface energy of the solidified film obtained by burning the film of the conductor composition ink by spin coating is exemplified by adjustment of a kind and a content of the liquid repellent.

When the surface energy of the solidified film is smaller than the lower limit value, since the content of the liquid repellent is large to aggregate the conductive material in the conductor composition ink, an ink state is not retainable. When the surface energy of the solidified film exceeds the upper limit value, the liquid repellency is reduced, so that a hole cannot be made in the insulation layer. From the same point of view, the surface energy of the solidified film is preferably in a range from 32 mN/m to 70 mN/m, more preferably in a range from 35 mN/m to 60 mN/m, particularly preferably in a range from 40 mN/m to 50 mN/m.

Coating Method and Burning Method of Conductor Composition Ink

In this step, the above-described conductor composition ink is applied in a pattern on the first electrode 22.

Herein, "applying the conductor composition ink in a pattern" means applying the conductor composition ink on the first electrode 22 in a manner to form a predetermined planar shape and excludes applying the conductor composition ink entirely over the wiring member 2 where the first electrode 22 is formed.

Figure 2A:
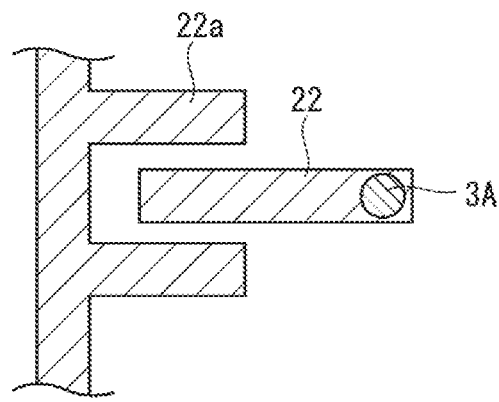
FIG. 2A is an illustration showing a conductor composition ink and a coating position thereof in the exemplary embodiment.
Figure 2B:
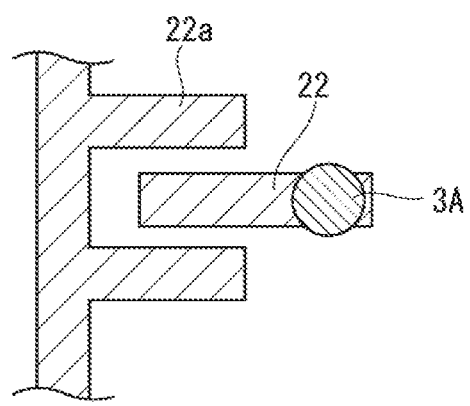
FIG. 2B is another illustration showing the conductor composition ink and the coating position thereof in the exemplary embodiment.

In this step, it is only required to apply the conductor composition ink on the first electrode 22. As shown in FIG. 2A, the conductor composition ink may be applied only on the first electrode 22 to form a deposit 3A. Alternatively, as shown in FIG. 2B, the conductor composition ink may be applied on and near the first electrode 22 to form the deposit 3A. Here, the conductor composition ink is usually applied on the first electrode 22 in a manner to avoid electrical continuity to another electrode 22a adjacent to the first electrode 22. In the exemplary embodiment, it is more preferable to apply the conductor composition ink only on the first electrode 22. This is because the shape of the conductive convex portion 3 can easily be adjusted by adjusting the surface wettability of the first electrode 22 and properties of the conductor composition ink.

FIGS. 2A and 2B each are an illustration showing a coating position of the conductor composition ink.

An application method of the conductor composition ink is not particularly limited as long as the conductor composition ink can be applied on the first electrode 22 in a predetermined pattern. Examples of the application method include an ink jet printing, dispenser method, screen printing, gravure printing, gravure offset printing, reverse offset printing, and letterpress printing. Among the examples, the ink jet printing is preferably used in the exemplary embodiment. This is because it is easy to apply the conductor composition ink only on the first electrode 22 by the ink jet printing.

A burning method of the conductor composition ink applied on the first electrode 22 is not particularly limited and any general burning method is usable as long as the solvent contained in the conductor composition ink can be removed to solidify the conductor composition ink. Specifically, the conductor composition ink can be burned using a hot plate and the like.

In this step, a treatment of promoting transfer of the liquid repellent by radiating ultrasonic waves before or during the burning may be conducted.

A burning temperature and a burning time in this step are appropriately adjusted depending on types of the solvent, the liquid repellent and the like contained in the conductor composition ink.

The burning temperature in this step is not particularly limited as long as the solvent contained in the conductor composition ink is removable, but is preferably in a range from 100 degrees C. to 220 degrees C., more preferably in a range from 120 degrees C. to 200 degrees C. When the burning temperature is excessively high, the conductive material may deteriorate such that it has difficulty exhibiting a desired electrical conductivity. When the burning temperature is excessively low, the solvent remains in the conductive convex portion, so that impurities may be mixed in the insulation layer in the later-described insulation layer forming step.

The burning time in this step is not particularly limited as long as the solvent contained in the conductor composition ink is removable, but is preferably in a range from 10 minutes to 60 minutes, more preferably in a range from 15 minutes to 60 minutes, particularly preferably in a range from 30 minutes to 60 minutes. When the burning time is excessively short, since a sufficient transfer of the liquid repellent of the conductor composition ink is difficult, it may be difficult for the conductive convex portion 3 to exhibit a favorable liquid repellency. When the burning time is excessively long, the conductive material and the like may deteriorate such that it has difficulty exhibiting a desired electrical conductivity. Moreover, productivity may be decreased.

Conductive Convex Portion

The conductive convex portion 3 is formed on the first electrode 22 in this step. The conductive convex portion 3 may include a plurality of conductive convex portions. The conductive convex portion 3 has liquid repellency and functions as the VIA post. The conductive convex portion 3 needs to be a conductor including the conductive material and the liquid repellent and having a surface energy from more than 30 mN/m to 80 mN/m. In the conductor, the conductive material and the liquid repellent are preferably exposed on a surface of the conductor in terms of the surface energy and electrical conductivity.

Herein, that "the conductive convex portion has liquid repellency" means that the contact angle between the surface of the conductive convex portion 3 and water is larger than the contact angle between the surface of the first electrode 22 and water and the contact angle between the surface of the base material 21 and water.

Specifically, that "the conductive convex portion has liquid repellency" means that a difference between the contact angle between the surface of the conductive convex portion 3 and water and the contact angle between the surface of the first electrode 22 and water is 5 degrees or more, preferably 20 degrees or more. This is because, at a small difference between the contact angles, it may be difficult to repel the resin composition using the difference in wettability when the resin composition is applied over the wiring member 2 where the conductive convex portion 3 is formed.

An upper limit value of the difference between the contact angles is not particularly limited, but appropriately determined depending on the materials of the conductive convex portion 3 and the material of the first electrode 22. For instance, the upper limit value is about 100 degrees.

Moreover, that "the conductive convex portion has liquid repellency" means that a difference between the contact angle between the surface of the conductive convex portion 3 and water and the contact angle between the surface of the base material 21 and water is 5 degrees or more, preferably 20 degrees or more. This is because, at a small difference between the contact angles, it may be difficult to repel the resin composition using the difference in wettability when the resin composition is applied over the wiring member 2 where the conductive convex portion 3 is formed.

The upper limit value of the difference between the contact angles is not particularly limited, but appropriately determined depending on the materials of the conductive convex portion 3 and the material of the base material 21. For instance, the upper limit value is about 100 degrees.

A position where the conductive convex portion 3 is formed is usually the same as the above-described coating position of the conductor composition ink.

The liquid repellency of the conductive convex portion 3 is not particularly limited as long as the conductive convex portion 3 can function as the VIA post by repelling the resin composition in the later-described insulation layer forming step. The contact angle between the surface of the conductive convex portion 3 and water is preferably 90 degrees or more, more preferably in a range from 100 degrees to 120 degrees. When the contact angle is excessively small, it may be difficult to repel the resin composition applied over the conductive convex portion 3, which may make it difficult to form the VIA post.

The planar shape of the conductive convex portion 3 is not particularly limited as long as the VIA post can be formed. Examples of the planar shape include a circular shape, elliptical shape, quadrangular shape, and polygonal shape. Among the examples, the planar shape of the conductive convex portion 3 is preferably a circular shape and an elliptical shape.

Figure 3A:
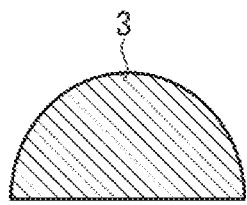
FIG. 3A is an illustration showing a vertical cross-sectional shape of a conductive convex portion in the exemplary embodiment.
Figure 3B:
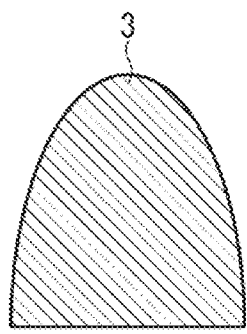
FIG. 3B is an illustration showing another vertical cross-sectional shape of the conductive convex portion in the exemplary embodiment.
Figure 3C:
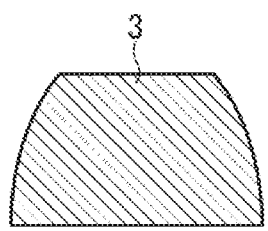
FIG. 3C is an illustration showing still another vertical cross-sectional shape of the conductive convex portion in the exemplary embodiment.

Examples of the vertical cross-sectional shape of the conductive convex portion 3 include a semicircular shape as shown in FIG. 3A, a semi-elliptical shape as shown in FIG. 3B, and a trapezoidal and a quadrangular shape (which are not shown). A flat portion or a dent may be formed in the middle of each of the vertical cross-sectional shapes of the conductive convex portion 3. FIG. 3C shows the conductive convex portion 3 having the flat portion in the middle of the semi-elliptical shape.

FIGS. 3A to 3C each are an illustration showing the vertical cross-sectional shape of the conductive convex portion 3 in the exemplary embodiment. The vertical cross-sectional shape of the conductive convex portion 3 refers to a cross-sectional shape of the conductive convex portion 3 in an orthogonal direction with respect to the base material 21.

A size of the conductive convex portion 3 is not particularly limited as long as the VIA post capable of establishing electrical continuity between the first electrode 22 and the later-described second electrode 6 via the conductive convex portion 3 can be formed. For instance, the size is preferably in a range from 1 μm to 5000 μm, more preferably in a range from 5 μm to 1000 μm, particularly preferably in a range from 10 μm to 100 μm. This is because, when the size of the conductive convex portion 3 is excessively large, it may be difficult to manufacture a highly-fine and highly-integrated laminated wiring member 1 in the exemplary embodiment. When the size of the conductive convex portion 3 is excessively small, it may be difficult to establish a favorable electrical continuity between the conductive convex portion 3 and the later-described second electrode 6.

It should be note that "the size of the conductive convex portion 3" means a size of the planar shape of the conductive convex portion 3. For instance, when the planar shape is a circle, the size means a diameter of the circle and when the planar shape is a square, the size means a length of a side of the square. When the planar shape is a shape having a long side and a short side (e.g., a rectangle and an ellipse), the size means a length of the short side. When the planar shape is a polygon, the size means a diameter of an inscribed circle of the polygon.

Figure 4:
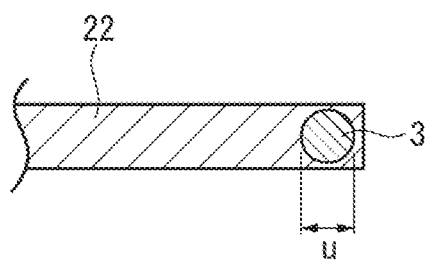
FIG. 4 is an illustration showing the conductive convex portion in the exemplary embodiment.

Specifically, the size of the conductive convex portion 3 means a distance represented by u in FIG. 4.

A height of the conductive convex portion 3 is not particularly limited as long as electrical continuity between the conductive convex portion 3 and the later-described second electrode 6 is established, but preferably in a range from 10 nm to 10000 nm, more preferably in a range from 100 nm to 8000 nm. This is because, when the height of the conductive convex portion 3 is excessively high, it may be difficult to provide a favorable flatness of a surface close to the second electrode 6 of the laminated wiring member 1 manufactured in the exemplary embodiment. When the height of the conductive convex portion 3 is excessively low, it may be difficult for the conductive convex portion 3 to exhibit a desired electrical conductivity.

It should be noted that "the height of the conductive convex portion 3" means a value representing the maximum vertical distance from the base material in the vertical cross-sectional shape of the conductive convex portion 3. Specifically, "the height of the conductive convex portion 3" means a distance represented by x in FIGS. 5A and 5B.

An aspect ratio, which is a ratio of the height to the size, of the conductive convex portion 3 is not particularly limited as long as the VIA post can be formed, but preferably in a range from 0.001 to 1, more preferably in a range from 0.01 to 0.8, particularly preferably in a range from 0.01 to 0.5. This is because, when the aspect ratio of the conductive convex portion 3 is excessively large, formation of the conductive convex portion 3 itself may be difficult or breakage and the like of the conductive convex portion 3 may be caused. When the aspect ratio of the conductive convex portion 3 is excessively small, it may be difficult for the conductive convex portion 3 to exhibit sufficient electrical conductivity and liquid repellency.

Second Step: Insulation Layer Forming Step

In insulation layer forming step, as shown in FIG. 1C, the coating film 4A of the resin composition is formed on the wiring member 2 where the conductive convex portion 3 is formed and the coating film 4A is cured, thereby forming the insulation layer 4 having the conductive convex portion 3 functioning as the VIA post (see FIG. 1D).

Resin Composition

The resin composition to be used in this step includes at least resin and, as needed, another component such as a polymerization initiator. Herein, the resin conceptionally includes a monomer, oligomer and polymer.

Examples of the resin include: an ionizing radiation curable resin (e.g., an acrylate type, epoxy type, and polyester type); and a thermosetting resin (e.g., an acrylate type, urethane type, epoxy type, and polysiloxane type). The ionizing radiation means electromagnetic waves or charged particles having energy enabling polymerization and curing.

Examples of the ionizing radiation include all ultraviolet radiation (UV-A, UV-B, UV-C), visible light, gamma ray, X-ray, and electron ray.

Among the example, the resin forming the resin composition is preferably the thermosetting resin. The insulation performance of the insulation layer 4 can be made more favorable by using the thermosetting resin.

The resin composition to be used in this step may be a fluorinated resin composition. The fluorinated resin composition includes at least a fluorinated resin and, as needed, another component such as the polymerization initiator.

Examples of a resin forming the fluorinated resin composition include fluorine-added polyimide, fluorine-added polyparaxylene, polystyrene, CYTOP (registered trademark), Teflon (registered trademark), Teflon (registered trademark) AF, and fluoropolyarylether. A representative example is CYTOP manufactured by ASAHI GLASS CO., LTD., but not limited thereto.

Among the example, the resin forming the fluorinated resin composition is preferably the thermosetting resin. The insulation performance of the insulation layer 4 can be made more favorable by using the thermosetting resin.

The resin composition usually contains a solvent. The solvent contained in the resin composition can be appropriately selected depending on the liquid repellency of the conductive convex portion 3, the wettability of the base where the insulation layer 4 is formed, and a viscosity and can be the same as a solvent used for a general resin composition.

When the resin composition is the fluorinated resin composition, the fluorinated resin composition usually contains a fluorinated solvent. However, when the fluorinated resin composition is used as the passivation layer, it is required to select a fluorinated solvent that does not damage a base layer (e.g., a semiconductor layer as the base) having a low tolerance against the solvent.

The resin composition may contain a polymerization initiator, photosensitizer, antioxidant, polymerization inhibitor, cross-linking agent, infrared absorbing agent, antistatic agent, viscosity modifier and adhesion improver.

The viscosity of the resin composition is not particularly limited as long as the resin composition has a predetermined coating performance and can be repelled with the liquid repellency of the conductive convex portion 3. Specifically, the viscosity of the resin composition at 25 degrees C. is preferably in a range from 1.0 mPa·s to 10000 mPa·s, more preferably in a range from 5 mPa·s to 1000 mPa·s, particularly preferably in a range from 20 mPa·s to 500 mPa·s. This is because, when the viscosity of the resin composition is excessively low, it may be difficult to form the coating film 4A of the resin composition. When the viscosity of the resin composition is excessively high, it may be difficult to obtain an advantage derived from the difference in the surface wettability.

A measurement method of the viscosity is not particularly limited as long as it is a method capable of accurately measuring the viscosity. Examples of the measurement method include a method using a viscosity measurement device such as a rtheometer, B-type viscometer, and capillary viscometer. Moreover, the measurement method of the viscosity includes a method using a digital viscometer (TV-35: manufactured by TOKISANGYOU CO., LTD).

The surface tension of the resin composition is not particularly limited as long as the resin composition has a predetermined coating performance and can be repelled with the liquid repellency of the conductive convex portion 3. Specifically, the surface tension of the resin composition at 25 degrees C. is preferably in a range from 5 mN/m to 70 mN/m, more preferably in a range from 10 mN/m to 50 mN/m. This is because, when the surface tension of the resin composition is excessively low, the conductive convex portion 3 is less likely to repel the resin composition. When the surface tension of the resin composition is excessively high, it may be difficult to form the insulation layer 4.

A measurement method of the surface tension is not particularly limited as long as being a method capable of accurately measuring the surface tension. Examples of the measurement method include a Wilhelmy method (plate method), hanging drop method (pendant drop method), Young-Laplace method and du Nouy method. Moreover, the measurement method of the surface tension includes a method using a highly accurate surface tensiometer (DY-700: manufactured by Kyowa Interface Science Co., Ltd.).

Forming Method of Insulation Layer

In this step, the insulation layer 4 is formed by applying the above-described resin composition on the wiring member 2 where the conductive convex portion 3 is formed.

The application method is not particularly limited as long as the insulation layer 4 having a desired thickness can be formed, but any general application method is usable. Specifically, examples of the application method include a slit coating, spin coating, die coating, roll coating, bar coating, LB method, dip coating, spray coating, blade coating and casting. Among the examples, the spin coating and the slit coating are preferably used in the exemplary embodiment. This is because the flatness of the insulation layer 4 can be made favorable.

A thickness of the coating film 4A of the resin composition is not particularly limited as long as the insulation layer 4 having the conductive convex portion 3 functioning as the VIA post can be formed. The thickness of the coating film 4A of the resin composition may be larger than, equal to, or less than the height of the conductive convex portion 3.

When the thickness of the coating film 4A of the resin composition is larger than the height of the conductive convex portion 3, the coating film 4A may be formed in a manner to cover the conductive convex portion 3. Adjustment of the viscosity and the surface tension of the resin composition allows the resin composition applied on the conductive convex portion 3 to be repelled from the conductive convex portion 3 as time passes.

A curing method of the coating film 4A of the resin composition is appropriately selected depending on types of the resin composition. Since a general curing method is usable, the description thereof is omitted.

Insulation Layer

The insulation layer 4 is formed to insulate the first electrode 22 from the later-described second electrode 6. The insulation layer 4 has the conductive convex portion 3 functioning as the VIA post.

Figure 5A:
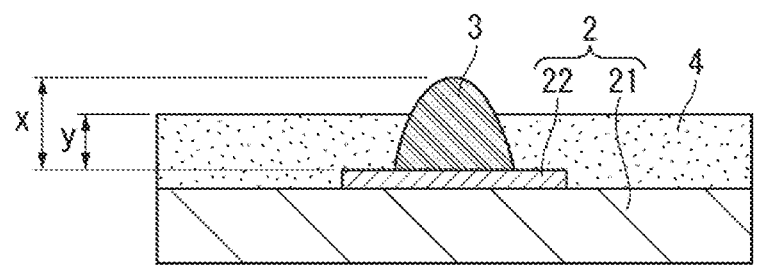
FIG. 5A is an illustration showing an insulation layer in the exemplary embodiment.
Figure 5B:
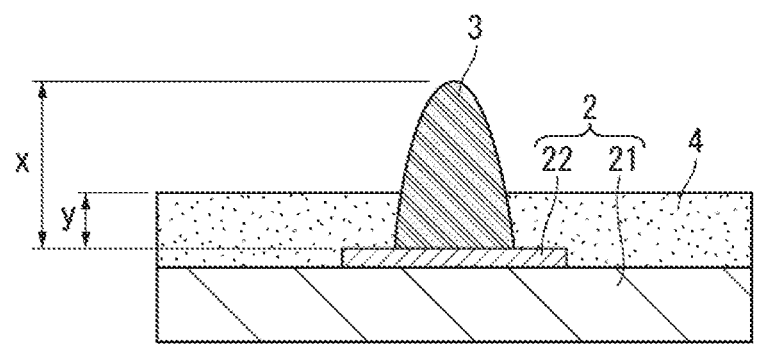
FIG. 5B is another illustration showing the insulation layer in the exemplary embodiment.

A thickness of the insulation layer 4 is not particularly limited as long as the first electrode 22 can be insulated from the later-described second electrode 6. Provided that the height of the conductive convex portion 3 is defined as x and the thickness of the insulation layer 4 on the first electrode 22 is defined as y as shown in FIGS. 5A and 5B, it is required that the height x of the conductive convex portion 3 is larger than the thickness y of the insulation layer 4 on the first electrode 22. In the exemplary embodiment, the height x of the conductive convex portion 3 is larger than the thickness y of the insulation layer 4 on the first electrode 22 as shown in FIGS. 5A and 5B. Since the later-described second electrode 6 can be more reliably formed on the conductive convex portion 3 functioning as the VIA post, a favorable electrical continuity between the first electrode 22 and the second electrode 6 can be established.

Moreover, since the surface, where the second electrode 6 is formed, of the laminated wiring member 1 manufactured in the exemplary embodiment can be made flatter, the laminated wiring member 1 can favorably be laminated with another structure.

"The thickness of the insulation layer 4 on the first electrode 22" means a distance from the surface of the first electrode 22 in a thickness direction of the insulation layer and the distance being represented by y in FIGS. 5A and 5B.

FIGS. 5A and 5B each are an illustration showing the insulation layer 4 in the exemplary embodiment.

The height x of the conductive convex portion 3 is preferably in a range from more than one time to 10 times of the thickness y of the insulation layer 4 on the first electrode 22. By setting a ratio of x to y within the above range, electrical continuity between the conductive convex portion 3 and the later-described second electrode 6 can be made easier.

The thickness y of the insulation layer 4 formed on the first electrode 22 is not particularly limited as long as the insulation layer 4 is capable of protecting the base layer such as a semiconductor layer, and can appropriately be selected depending on usage of the laminated wiring member 1 manufactured in the exemplary embodiment. The thickness y is preferably in a range from 0.1 µm to 10 µm, more preferably in a range from 0.5 µm to 5 µm. When the thickness of the insulation layer 4 is excessively large, it may be difficult for the conductive convex portion 3 to function as the VIA post. When the thickness of the insulation layer 4 is excessively small, it may be difficult for the insulation layer 42 to exhibit a sufficient protective performance.

The insulation layer 4 formed in this step has the conductive convex portion 3 functioning as the VIA post. In the insulation layer 4, a part of the conductive convex portion 3 projects from the insulation layer 4.

In this step, it is only required to form the insulation layer 4 at least having a single layer. Alternatively, the insulation layer 4 having a plurality of layers may be formed.

Third Step: Second Electrode Forming Step

In the second electrode forming step, as shown in FIG. 1E, the second electrode 6 is formed on the insulation layer 4 so as to establish electrical continuity with the conductive convex portion 3 functioning as the VIA post. In this arrangement, at least the part of the conductive convex portion 3 projecting from the insulation layer 4 is in contact with the second electrode 6 to bring the conductive convex portion 3 and the second electrode 6 into electrical continuity with each other.

A material of the second electrode 6 is not particularly limited as long as it has a desired electrical conductivity and can appropriately be selected from the above-described material of the first electrode 22.

The second electrode 6 is usually formed in a pattern on the insulation layer 4. A planar shape of the second electrode 6 can be appropriately selected depending on a type of the laminated wiring member 1 manufactured by the manufacturing method according to the exemplary embodiment.

Since a forming method of the second electrode 6 can be the same as the above-described forming method of the first electrode 22, a description of the forming method of the second electrode 6 is omitted herein. A thickness of the second electrode 6 is not particularly limited as long as the second electrode 6 can be brought into electrical continuity with the conductive convex portion 3 and the first electrode 22. When the thickness of the second electrode 6 is equal to or less than the difference between the thickness of the insulation layer 4 and the height of the conductive convex portion 3, the electrical continuity is sometimes difficult to establish. Specifically, the thickness of the second electrode 6 is preferably in a range from 30 nm to 5000 nm, more preferably in a range from 50 nm to 4000 nm, particularly preferably in a range from 200 nm to 2000 nm.

In this step, the conductive convex portion 3 may be subjected to a hydrophilization treatment before the second electrode 6 is formed. The hydrophilization treatment is not particularly limited as long as a decrease in the electrical conductivity of the conductive convex portion 3 can be inhibited and the contact angle of the surface of the conductive convex portion 3 and water can be decreased. The hydrophilization treatment is exemplified by a hydrophilization treatment using hydrogen plasma.

Other Step(s)

The manufacturing method of the laminated wiring member in the exemplary embodiment is not particularly limited as long as including the above-described steps. A necessary step can appropriately be selected and added to the manufacturing method. For instance, a step of forming the above-described wiring member 2 may be added.

Usage

The manufacturing method of the laminated wiring member in the exemplary embodiment is applicable to a manufacturing method having a laminate structure in which two electrodes are in electrical continuity with each other via the VIA post. Specifically, the manufacturing method of the laminated wiring member in the exemplary embodiment is applicable to a manufacturing method of a semiconductor device, touch panel sensor, RF-ID (Radio Frequency Identification), organic electroluminescence device, flexible printed circuits (FPC) and the like.

Laminated Wiring Member

The laminated wiring member 1 in the exemplary embodiment can be manufactured, for instance, by the above-described manufacturing method of the laminated wiring member. The laminated wiring member 1 in the exemplary embodiment includes: the wiring member 2 including the base material 21 and the first electrode 22 formed on the base material 21; the conductive convex portion 3 including the conductive material and the liquid repellent, being formed on the first electrode 22 in a pattern, and being in electrical continuity with the first electrode 22, and functioning as the VIA post; the insulation layer 4 formed of the resin composition and having the conductive convex portion 3; and the second electrode 6 in electrical continuity with the conductive convex portion 3 and formed on the insulation layer 4.

The laminated wiring member 1 in the exemplary embodiment is usable for electronic equipment such as a liquid crystal display, television set, car navigation system, mobile phone, gaming hardware, digital camera, personal computer and printer.

Manufacturing Method of Semiconductor Device

Next, a manufacturing method of a semiconductor device in the exemplary embodiment will be described with reference to the attached drawings.

Since a part of steps of the manufacturing method of the semiconductor device in the exemplary embodiment is common to the above-described manufacturing method of the laminated wiring member in the exemplary embodiment, a part of the detailed description is omitted or simplified.

In the following description, a "semiconductor transistor" means a structure having a source electrode, drain electrode, semiconductor layer, and gate electrode.

The manufacturing method of the laminated wiring member in the exemplary embodiment includes the first step (conductive convex portion forming step), the second step (insulation layer forming step), and the third step (electrode forming step).

FIGS. 6A to 6D illustrate steps of the manufacturing method of the semiconductor device in the exemplary embodiment.

Figure 6A:
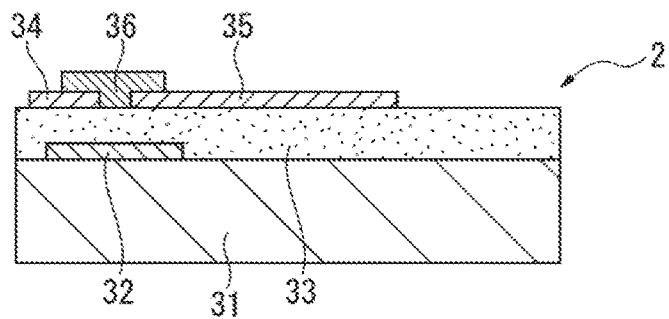
FIG. 6A illustrates a step of a manufacturing method of a semiconductor device in the exemplary embodiment.
Figure 6B:
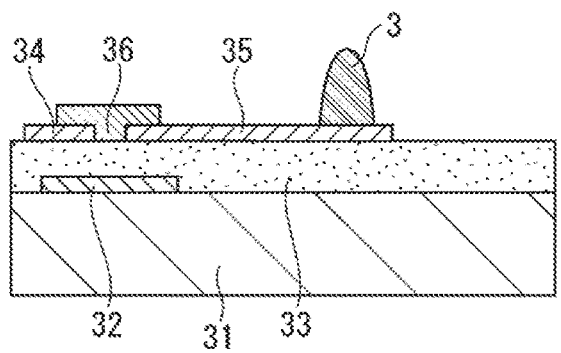
FIG. 6B illustrates another step of the manufacturing method of the semiconductor device in the exemplary embodiment.
Figure 6C:
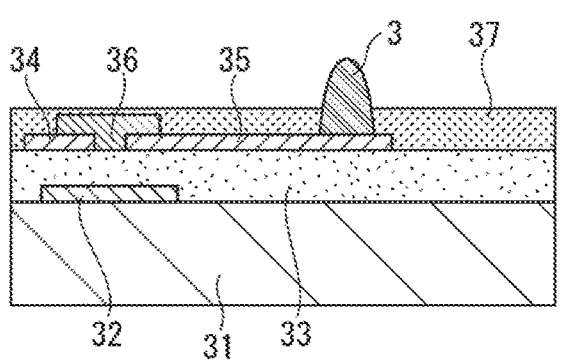
FIG. 6C illustrates a further step of the manufacturing method of the semiconductor device in the exemplary embodiment.
Figure 6D:
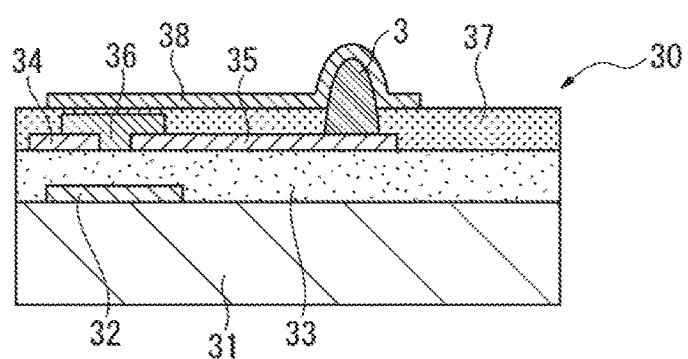
FIG. 6D illustrates a still further step of the manufacturing method of the semiconductor device in the exemplary embodiment.

FIGS. 6A to 6D illustrate an example of manufacturing the semiconductor device having a bottom-gate bottom-contact type semiconductor transistor. In the manufacturing method of the semiconductor device in the exemplary embodiment, as shown in FIG. 6A, the wiring member 2 is prepared, the wiring member 2 including: a base material 31; a gate electrode 32 formed on the base material 31; a gate insulation layer 33 formed to cover the gate electrode 32; a source electrode 34 and a drain electrode 35 that are formed on the gate insulation layer 33; and a semiconductor layer 36 formed in a channel region between the source electrode 34 and the drain electrode 35. Next, the conductor composition ink containing the conductive material, the liquid repellent and the solvent is applied in a pattern on the drain electrode 35 and burned, thereby forming the liquid-repellent conductive convex portion 3 in electrical continuity with the drain electrode 35 as shown in FIG. 6B (conductive convex portion forming step). Next, the resin composition is applied in a manner to cover the source electrode 34, the drain electrode 35 and the semiconductor layer 36 to form a film and the film is cured (not shown), thereby forming a passivation layer 37 as the insulation layer 4 having the conductive convex portion 3 functioning as the VIA post as shown in FIG. 6C (insulation layer forming step). Subsequently, as shown in FIG. 6D, an external input/output electrode 38 is formed on the passivation layer 37 so as to establish electrical continuity with the conductive convex portion 3 functioning as the VIA post (electrode forming step). By the above steps, a semiconductor device 30 can be manufactured.

Figure 7A:
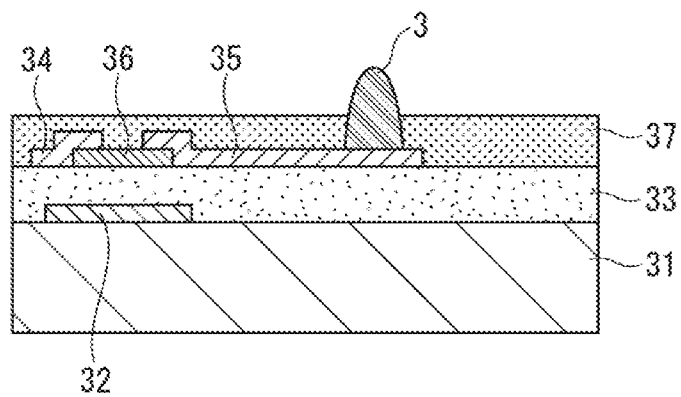
FIG. 7A illustrates a step of another manufacturing method of the semiconductor device in the exemplary embodiment.
Figure 7B:
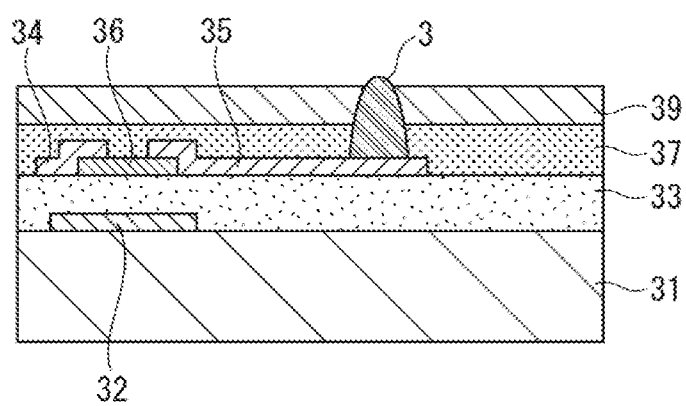
FIG. 7B illustrates another step of the another manufacturing method of the semiconductor device in the exemplary embodiment.
Figure 7C:
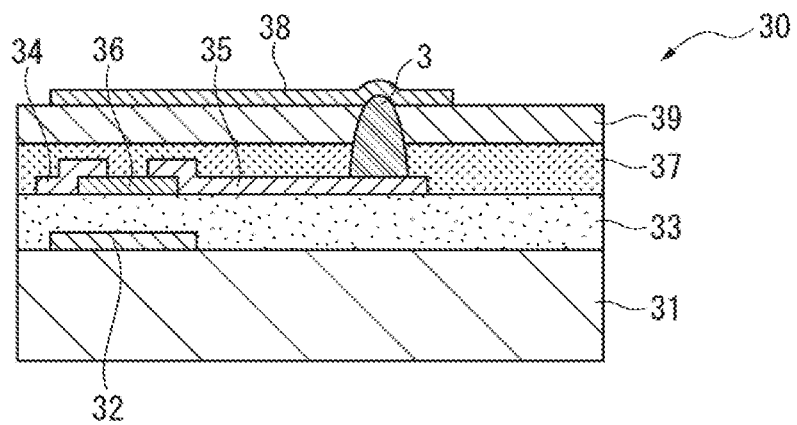
FIG. 7C illustrates still another step of the another manufacturing method of the semiconductor device in the exemplary embodiment.

FIGS. 7A to 7C illustrate steps of another manufacturing method of the semiconductor device in the exemplary embodiment. FIGS. 7A to 7C illustrate an example of manufacturing a semiconductor device having a bottom-gate top-contact type semiconductor transistor. In the second step (the insulation layer forming step) in the exemplary embodiment, two or more insulation layers may be formed. As the insulation layers, for instance, the passivation layer 37 may be formed by applying resin composition in a manner to cover the source electrode 34, the drain electrode 35 and the semiconductor layer 36 as shown in FIG. 7A, and subsequently, a light blocking layer 39 may be formed by applying a light-blocking resin composition on the passivation layer 37 to form a coating film and curing the coating film as shown in FIG. 7B. In this case, by adjusting properties of each of the resin composition and the light-blocking resin composition, the conductive convex portion 3 formed on the drain electrode 35 can serve as the conductive convex portion 3 penetrating the passivation layer 37 and the light blocking layer 39 and functioning as the VIA post.

FIG. 7C illustrates a step of forming the external input/output electrode 38 on the light blocking layer 39.

Since the same description in FIGS. 6A to 6D can be applied to reference numerals in FIGS. 7A to 7C which are not described, the description of the reference numerals is omitted herein.

Figure 8A:
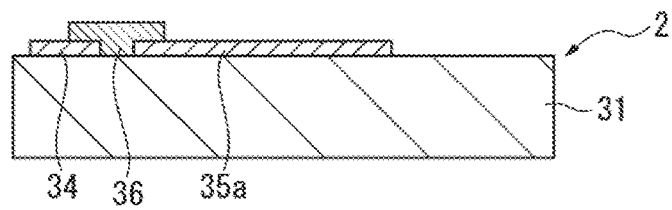
FIG. 8A illustrates a step of still another manufacturing method of the semiconductor device in the exemplary embodiment.
Figure 8B:
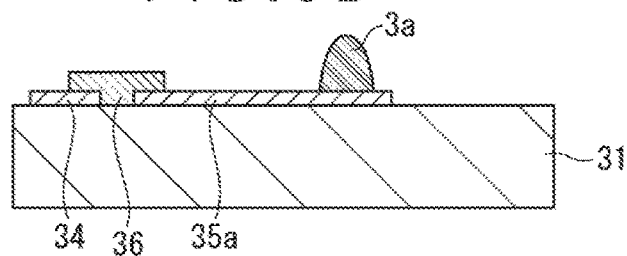
FIG. 8B illustrates another step of the still another manufacturing method of the semiconductor device in the exemplary embodiment.
Figure 8C:
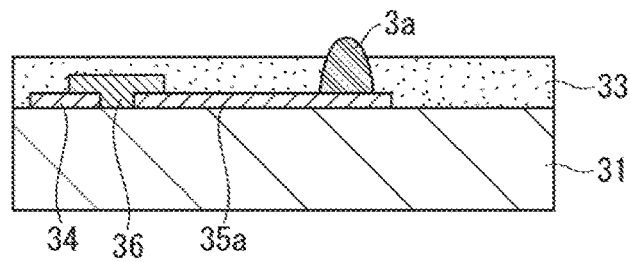
FIG. 8C illustrates still another step of the still another manufacturing method of the semiconductor device in the exemplary embodiment.
Figure 8D:
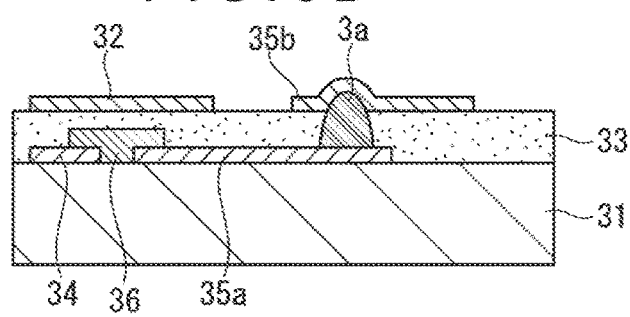
FIG. 8D illustrates a further step of the still another manufacturing method of the semiconductor device in the exemplary embodiment.
Figure 8E:
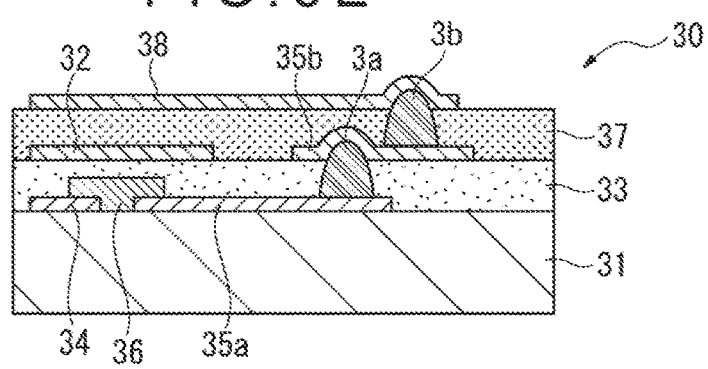
FIG. 8E illustrates a still further step of the still another manufacturing method of the semiconductor device in the exemplary embodiment.

FIGS. 8A to 8E illustrate steps of still another manufacturing method of the semiconductor device in the exemplary embodiment. FIGS. 8A to 8E illustrate an example of manufacturing a semiconductor device having a top-gate bottom-contact type semiconductor transistor. In the manufacturing method of the semiconductor device in the exemplary embodiment, as shown in FIG. 8A, the wiring member 2 is prepared, the wiring member 2 including: the base material 31; the source electrode 34 and a drain electrode 35a that are formed on the base material 31; and the semiconductor layer 36 formed in a channel region between the source electrode 34 and the drain electrode 35a. Next, the conductor composition ink containing the conductive material, the liquid repellent and the solvent is applied in a pattern on the drain electrode 35a and burned, thereby forming a liquid-repellent conductive convex portion 3a in electrical continuity with the drain electrode 35a as shown in FIG. 8B (conductive convex portion forming step). Next, the resin composition is applied in a manner to cover the source electrode 34, the drain electrode 35a and the semiconductor layer 36 to form a film and the film is cured (not shown), thereby forming the gate insulation layer 33 as the insulation layer having the conductive convex portion 3a functioning as the VIA post as shown in FIG. 8C (insulation layer forming step). Subsequently, as shown in FIG. 8D, the gate electrode 32 is formed on the gate insulation layer 33. Simultaneously with the formation of the gate electrode 32, an intermediate electrode 35b is formed on the gate insulation layer 33 so as to establish electrical continuity with the conductive convex portion 3a functioning as the VIA post (electrode forming step). Moreover, in the exemplary embodiment, as needed after the formation of the intermediate electrode 35b, the conductor composition ink is again applied in a pattern on the intermediate electrode 35b and burned, thereby forming a liquid-repellent conductive convex portion 3b in electrical continuity with the intermediate electrode 35b as shown in FIG. 8E (conductive convex portion forming step). Subsequently, the resin composition is applied in a manner to cover the gate electrode 32 and the intermediate electrode 35b to form a film and the film is cured, thereby forming the passivation layer 37 having the conductive convex portion 3b functioning as the VIA post (insulation layer forming step). Next, the external input/output electrode 38 is formed on the passivation layer 37 so as to establish electrical continuity with the conductive convex portion 3b functioning as the VIA post (electrode forming step). By the above steps, the semiconductor device 30 can be manufactured.

Figure 9:
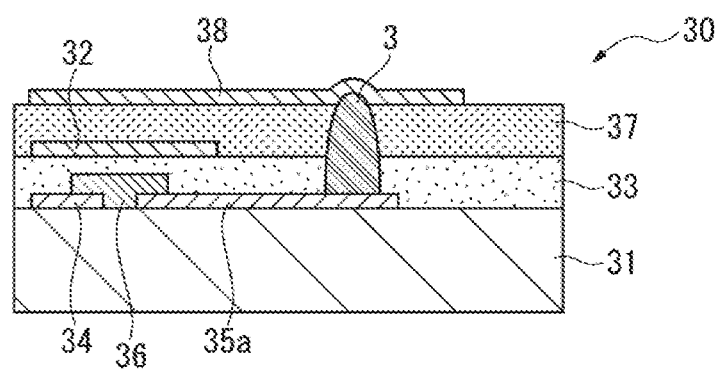
FIG. 9 schematically illustrates a cross-section of the semiconductor device manufactured in the exemplary embodiment.

In the exemplary embodiment, as shown in FIG. 9, the gate insulation layer 33 and the passivation layer 37 may be laminated as the insulation layer when manufacturing the semiconductor device 30 having a top-gate type semiconductor transistor. The same description in FIGS. 7A to 7C can be applied to the steps of forming the insulation layer having the plurality of layers, the steps including the insulation layer forming step. Accordingly, the description of the steps is omitted herein.

FIG. 9 schematically illustrates a cross-section of an example of the semiconductor device manufactured in the exemplary embodiment, the example showing the semiconductor device having a top-gate top-contact type semiconductor transistor.

According to the exemplary embodiment, since the conductive convex portion forming step for forming the liquid-repellent conductive convex portion 3 and the insulation layer forming step for forming the insulation layer 4 are provided, the insulation layer having the VIA post can be formed in a simple way.

First Step: Conductive Convex Portion Forming Step

In the conductive convex portion forming step, the wiring member 2 is prepared, the wiring member 2 including: the base material 31; and the source electrode 34 and the drain electrode 35 that are formed on the base material 31 (or the gate insulation layer 33 formed on the base material 31); and the semiconductor layer 36 formed in a channel region between the source electrode 34 and the drain electrode 35. The conductor composition ink containing the conductive material, the liquid repellent and the solvent is applied in a pattern on the drain electrode 35 and burned, thereby forming the liquid repellent conductive convex portion 3 in electrical continuity with the drain electrode 35 and functioning as the VIA post.

Wiring Member

A structure of the wiring member 2 depends on the structure of the semiconductor transistor. For instance, when manufacturing the semiconductor device having the bottom-gate bottom-contact type semiconductor transistor as shown in FIG. 6A, the wiring member 2 includes the base material 31, the gate electrode 32, the gate insulation layer 33, the source electrode 34, the drain electrode 35 and the semiconductor layer 36. A structure of each of the components will be described below. Since the base material 31 can be the same as that used in the above-described manufacturing method of the laminated wiring member, the description of the base material 31 is omitted herein.

The source electrode 34 and the drain electrode 35 are formed to have a desired channel region between the source electrode 34 and the drain electrode 35.

The source electrode 34 and the drain electrode 35 may be formed directly on the base material 31, or alternatively, may be formed on the gate insulation layer 33 described below.

A size of the channel region between the source electrode 34 and the drain electrode 35 is not particularly limited but is appropriately selected depending on usage of the semiconductor device.

A channel length is not particularly limited as long as the semiconductor layer can be formed in the channel region, but preferably in a range from 1 μm to 100 μm, more preferably in a range from 3 μm to 50 μm, particularly preferably in a range from 5 μm to 10 μm. The channel length means a distance between the source electrode 34 and the drain electrode 35.

A material of the source electrode 34 and the drain electrode 35 can appropriately be selected from the above-described material of the first electrode in the manufacturing method of the laminated wiring member. Since a thickness and a forming method of each of the source electrode 34 and the drain electrode 35 can be the same as those of the first electrode in the manufacturing method of the laminated wiring member, the description of the thickness and the forming method of each of the source electrode 34 and the drain electrode 35 is omitted herein.

The semiconductor layer 36 is formed in a region including the channel region between the source electrode 34 and the drain electrode 35. Moreover, the semiconductor layer 36 imparts semiconductor characteristics to the semiconductor transistor.

A formation position of the semiconductor layer 36 is appropriately selected depending on the structure of the semiconductor transistor, but is generally formed on the base material 31 as shown in FIGS. 8A and 9, or alternatively, on the gate insulation layer 33 as shown in FIGS. 6A and 7A. Further alternatively, the semiconductor layer 36 may be formed on the source electrode 34 and the drain electrode 35, 35a as shown in FIGS. 6A and 8A and 9, or the source electrode 34 and the drain electrode 35 may be formed on the semiconductor layer 36 as shown in FIG. 7A.

The formation position of the semiconductor layer 36 is not particularly limited as long as the semiconductor layer 36 is formed in the channel region between the source electrode 34 and the drain electrode 35. Since the same pattern used for a known semiconductor device can be applied to a specific pattern of the semiconductor layer 36, the description of the pattern is omitted herein.

The semiconductor layer 36 may be an organic semiconductor layer or an inorganic semiconductor layer.

A material, a thickness and a forming method of the organic semiconductor layer can be the same as those used in a general organic semiconductor layer. A material, a thickness and a forming method of the inorganic semiconductor layer can be the same as those used in a general inorganic semiconductor layer.

When the semiconductor device 30 manufactured in the exemplary embodiment has a bottom-gate type semiconductor transistor, the gate electrode 32 and the gate insulation layer 33 are usually formed between the base material 31 and the source electrode 34/drain electrode 35 in the wiring member 2.

The gate electrode 32 is usually formed on the base material 31 as shown in FIGS. 6A and 7A.

A material of the gate electrode 32 can appropriately be selected from the above-described material of the first electrode in the manufacturing method of the laminated wiring member. Since a thickness and a forming method of the gate electrode 32 can be the same as those of the first electrode in the manufacturing method of the laminated wiring member, the description of the thickness and the forming method of the gate electrode 32 is omitted herein.

The gate insulation layer 33 is formed to insulate the gate electrode 32 from the source electrode 34 and the drain electrode 36 and is usually formed on the gate electrode 32 as shown in FIGS. 6A and 7A.

Since a material, a thickness and a forming method of the gate insulation layer 33 can be the same as those of the wiring-member insulation layer in the manufacturing method of the laminated wiring member, the description of the material, the thickness and the forming method of the gate insulation layer 33 is omitted herein.

Conductor Composition Ink

Since the conductor composition ink, the application method and the burning method thereof, and the conductive convex portion can be the same as those in the above-described manufacturing method of the laminated wiring member, the description of the conductor composition ink, the application method and the burning method thereof, and the conductive convex portion is omitted herein.

Second Step: Insulation Layer Forming Step

In the insulation layer forming step, the resin composition is applied in a manner to cover the source electrode 34, the drain electrode 35 and the semiconductor layer 36 to form a film and the film is cured, thereby forming the insulation layer (e.g., the passivation layer 37) having the conductive convex portion 3 functioning as the VIA post.

Since the insulation layer forming step can be the same as the insulation layer forming step in the above-described manufacturing method of the laminated wiring member, the description of the insulation layer forming step is omitted herein.

The insulation layer formed in this step is appropriately selected depending on the structure of the semiconductor transistor. For instance, when the semiconductor device 30 manufactured in the exemplary embodiment has a top-gate type semiconductor transistor, at least the gate insulation layer 33 is formed as the insulation layer.

On the other hand, when the semiconductor device 30 manufactured in the exemplary embodiment has a bottom-gate type semiconductor transistor, at least one of the passivation layer 37 and the light blocking layer 39 is formed as the insulation layer.

The passivation layer 37 is provided for preventing the semiconductor layer from being deteriorated due to action of water and oxygen existing in air. When a low molecular organic semiconductor is used for the semiconductor layer, a low tolerance of the semiconductor layer against the solvent is a concern. Accordingly, the passivation layer 37 also has a role to protect the semiconductor layer from the solvent when forming the upper layer.

When the above-described semiconductor layer 36 includes an organic semiconductor material, the light blocking layer 39 is provided for blocking light irradiation to the organic semiconductor layer. Due to the formation of the light blocking layer 39, an increase of off-current and deterioration of the organic semiconductor layer over time can be inhibited.

When forming the light blocking layer 39 as the insulation layer, the resin composition contains a light-blocking material. Since the light-blocking material can be the same as that used for a general organic semiconductor device, the description of the light-blocking material is omitted herein.

In this step, it is only required to form at least one of the gate insulation layer 33, the passivation layer 37 and the light blocking layer 39. Alternatively, two or more of the gate insulation layer 33, the passivation layer 37 and the light blocking layer 39 may be laminated. Moreover, each of the gate insulation layer 33, the passivation layer 37 and the light blocking layer 39 may be formed including a plurality of layers.

Since a relationship between the thickness of each of the layers and the height of the conductive convex portion can be the same as the relationship between the thickness of the insulation layer and the height of the conductive convex portion in the manufacturing method of the laminated wiring member, the description of the relationship is omitted herein.

Third Step: Electrode Forming Step

In the electrode forming step, the intermediate electrode 35b or the external input/output electrode 38 is formed on the insulation layer (e.g., the passivation layer 37, the gate insulation layer 33) so as to establish electrical continuity with the conductive convex portion 3 functioning as the VIA post.

The electrode formed in this step is appropriately selected depending on the structure of the semiconductor transistor. For instance, when the semiconductor device 30 manufactured in the exemplary embodiment has a top-gate type semiconductor transistor, the intermediate electrode 35b is sometimes formed in addition to the gate electrode 32 as shown in FIG. 8D. The intermediate electrode 35b is used for connecting the drain electrode 35a to the external input/output electrode 38. Alternatively, the external input/output electrode 38 may be formed on the passivation layer 37.

On the other hand, when the semiconductor device 30 manufactured in the exemplary embodiment has a bottom-gate type semiconductor transistor, the external input/output electrode 38 is formed on the passivation layer 37.

Since the electrode forming step can be the same as the second electrode forming step in the above-described manufacturing method of the laminated wiring member, the description of the electrode forming step is omitted herein.

The external input/output electrode 38 formed in this step can be the same as that used in a general semiconductor layer. For instance, when the semiconductor device 30 manufactured in the exemplary embodiment is used for driving a display device, the external input/output electrode 38 may be in a form of a pixel electrode. Moreover, when the semiconductor device 30 manufactured in the exemplary embodiment is used in a pressure sensor and a temperature sensor, the external input/output electrode 38 may be in a form of an input electrode.

A planar shape of each of the external input/output electrode 38 and the intermediate electrode 35b can be appropriately selected depending on usage of the semiconductor device 30 manufactured in the exemplary embodiment.

Other Step(s)

The manufacturing method of the semiconductor device in the exemplary embodiment is not particularly limited as long as it include the above-described steps. A necessary step(s) can appropriately be selected and added to the manufacturing method.

Moreover, when the semiconductor device 30 manufactured in the exemplary embodiment has a top-gate type semiconductor transistor and the intermediate electrode 35b, a step of forming the passivation layer 37 on the intermediate electrode 35b and a step of forming the external input/output electrode 38 on the passivation layer 37 are usually performed. In this case, the passivation layer 37 having the conductive convex portion 3b functioning as the VIA post may be formed as shown in FIGS. 8A to 8E.

Structure of Semiconductor Device

The semiconductor transistor of the semiconductor device 30 manufactured in the exemplary embodiment may be of a bottom-gate top-contact type, a bottom-gate bottom-contact type, top-gate top-contact type, or top-gate bottom-contact type.

Usage

The semiconductor device 30 manufactured in the exemplary embodiment is usable as a TFT array base material of a TFT-type display device. Examples of such display device include a liquid crystal display device, an electrophoretic display device, and an organic EL display device. Moreover, the semiconductor device is usable in a temperature sensor and a pressure sensor.

Semiconductor Device

The semiconductor device 30 in the exemplary embodiment can be manufactured, for instance, by the above-described manufacturing method of the semiconductor device. The semiconductor device 30 in the exemplary embodiment includes: the wiring member 2 including the base material 31, the source electrode 34 and the drain electrode 35, 35a formed on the base material 31, and the semiconductor layer 36 formed in the channel region between the source electrode 34 and the drain electrode 35, 35a; the conductive convex portion 3, 3a containing the conductive material and the liquid repellent, being formed in a pattern on the drain electrode 35, 35a, being in electrical continuity with the drain electrode 35, 35a, and functioning as the VIA post; the insulation layer (e.g., the passivation layer 37) formed of the resin composition and having the conductive convex portion 3, 3a; and the intermediate electrode 35b or the external input/output electrode 38 in electrical continuity with the conductive convex portion 3, 3a and formed on the insulation layer (e.g., the passivation layer 37).

The semiconductor device 30 in the exemplary embodiment is usable for electronic equipment such as a liquid crystal display, television set, car navigation system, mobile phone, gaming hardware, digital camera, personal computer and printer.

Modifications of Embodiment

It should be understood that the scope of the invention is not limited to the above-described exemplary embodiment(s) but includes modifications and improvements as long as the modifications and improvements are compatible with the invention.

For instance, although the first electrode and the second electrode are brought into electrical continuity with each other to manufacture the laminated wiring member having two layers that are the wiring electrode in the manufacturing method of the exemplary embodiment, the manufacturing method of the laminated wiring member is not limited thereto. Even when the wiring electrode is of three layers, the manufacturing method of the laminated wiring member in the exemplary embodiment is applicable.

EXAMPLE(S)

Next, the invention will be described more in detail by Examples and Comparatives. However, the invention is by no means limited to the Examples and Comparatives.

Example 1

As the base material, glass (Eagle XG manufactured by Corning Incorporated, size: 40 mm×40 mm, thickness: 0.7 mm) was prepared. Next, a conductor composition ink was applied on a surface of the base material by spin coating to form a film, the conductor composition ink being a mixture of silver nano-colloids (mean particle size: 40 nm), 2,3,5, 6-tetrafluoro-4-(trifluoromethyl)benzenethiol and a solvent (a mixture solvent of water, ethylene glycol, 1,3-propanediol and glycerin) at a mass ratio of 39.7:0.8:59.5. The film was burned at 180 degrees C. for 30 minutes to form a solidified film. When measuring a surface energy of the solidified film, the surface energy was 48.3 mN/m.

Example 2

As the base material, glass (Eagle XG manufactured by Corning Incorporated, size: 40 mm×40 mm, thickness: 0.7 mm) was prepared. A gold film was formed on the surface of the base material by vacuum deposition. A thickness of the gold thin-film was measured with a step gauge (KLA-Tencor P-15), so that the thickness was 50 nm.

The conductor composition ink used in Example 1 was repeatedly discharged by ink jet printing at the same position on the gold electrode and burned at 180 degrees C. for 30 minutes to form a liquid-repellent conductive convex portion. The conductive convex portion had a diameter of 30 μm and a height of 5.5 μm.

In order to prepare the resin composition, 5 mass % of poly(methyl methacrylate) (PMMA) (Sigma-Aldrich 445746) was dissolved in 1-methoxy-2-propyl acetate (manufactured by KANTO KAGAKU). A surface tension of the resin composition was measured at 25 degrees C. using a highly accurate surface tensiometer (DY-700: manufactured by Kyowa Interface Science Co., Ltd.), so that the surface tension was 29.4 mN/m. A viscosity of the resin composition was measured at 25 degrees C. using a digital viscometer (DV-E manufactured by EKO Instruments), so that the viscosity was 113 mPa·s.

The above resin composition was applied using an applicator (PI-1210: automatic applicator) on the surface of the base material where the conductive convex portion was formed. Subsequently, the resin composition was dried for five minutes on a hot plate (EC-1200NP manufactured by AS ONE Corporation) heated at 130 degrees C., so that the insulation layer was formed of PMMA. A surface of the insulation layer was observed using a microscope (MX61 manufactured by OLYMPUS CORPORATION), where it was found that the insulation layer had an aperture on the conductive convex portion.

Moreover, a gold thin-film having a thickness of 50 nm was formed by vacuum deposition in a manner to be orthogonal to the above-described gold electrode. An electrical continuity between the lower gold electrode and the upper gold electrode was checked and ascertained.

From the above, it was ascertained that the insulation layer was penetrated by the conductive convex portion and had the aperture and the conductive convex portion functioned as the VIA post.

Example 3

As the base material, glass (Eagle XG manufactured by Corning Incorporated, size: 40 mm×40 mm, thickness: 0.7 mm) was prepared. Next, a conductor composition ink was applied on a surface of the base material by spin coating to form a film, the conductor composition ink being a mixture of silver nano-colloids (mean particle size: 40 nm), 2,3,5, 6-tetrafluoro-4-(trifluoromethyl)benzenethiol and a solvent (a mixture solvent of water, ethylene glycol, 1,3-propanediol and glycerin) at a mass ratio of 39.4:1.5:59.1. The film was burned at 180 degrees C. for 30 minutes to form a solidified film. When measuring a surface energy of the solidified film, the surface energy was 43.8 mN/m.

Example 4

As the base material, glass (Eagle XG manufactured by Corning Incorporated, size: 40 mm×40 mm, thickness: 0.7 mm) was prepared. A gold thin-film having a thickness of 50 nm was formed the surface of the base material by vacuum deposition. The conductor composition ink used in Example 3 was repeatedly discharged by ink jet printing on the above gold electrode and burned at 180 degrees C. for 30 minutes to form a liquid-repellent conductive convex portion. The conductive convex portion had a diameter of 26 μm and a height of 5 μm.

CYTOP (CTL-809M, manufactured by ASAHI GLASS CO., LTD.) was used as a fluorinated resin composition. A surface tension of CYTOP was measured at 25 degrees C. using the highly accurate surface tensiometer, so that the surface tension was 19 mN/m. A viscosity of the fluorinated resin composition was measured at 25 degrees C. using a digital viscometer (TV-35: manufactured by TOKI SANGYOU CO., LTD), so that the viscosity was 311 mPa·s. It should be noted that CYTOP may appropriately be diluted with a fluorinated solvent.

The above fluorinated resin composition was applied on the surface of the base material on which the conductive convex portion was formed while being rotated at 500 rpm for five seconds and subsequently at 4000 rpm for 30 seconds using a spin coater (MS-A15 manufactured by MICAS A CO., LTD). Subsequently, the applied fluorinated resin composition was dried for 30 minutes on the hot plate heated at 180 degrees C., so that a fluorinated insulation layer was formed of CYTOP. When a surface of the fluorinated insulation layer was observed using the microscope, the fluorinated insulation layer had an aperture having a diameter of 12.5 μm around the center of the conductive convex portion and the surface of the conductive convex portion was exposed. A thickness of the fluorinated insulation layer was measured with the step gauge, so that the thickness was 400 nm. Moreover, when a region including the conductive convex portion was measured with the step gauge in the same manner, the surface of the conductive convex portion was at a position higher by 4.6 μm than the surface of the fluorinated insulation layer, thereby creating a level difference in height between the conductive convex portion and fluorinated insulation layer.

Moreover, a gold thin-film having a thickness of 50 nm was formed by vacuum deposition in a manner to be orthogonal to the above-described gold electrode. An electrical continuity between the lower gold electrode and the upper gold electrode was checked and ascertained.

From the above, it was ascertained that the fluorinated insulation layer was penetrated by the conductive convex portion and had the aperture and the conductive convex portion functioned as the VIA post.

Comparative 1

As the base material, glass (Eagle XG manufactured by Corning Incorporated, size: 40 mm×40 mm, thickness: 0.7 mm) was prepared. A commercially available silver nano-ink (Sigma-Aldrich 736465-100G) was applied on the surface of the base material by spin coating to form a film and the film was burned at 180 degrees C. for 30 minutes to form a solidified film. When measuring a surface energy of the solidified film, the surface energy was 90.9 mN/m.

Comparative 2

As the base material, glass (Eagle XG manufactured by Corning Incorporated, size: 40 mm×40 mm, thickness: 0.7 mm) was prepared. A gold thin-film was formed on the surface of the base material by vacuum deposition. A thickness of the gold thin-film was measured by the step gauge, so that the thickness was 50 nm. A commercially available silver nano-ink (Sigma-Aldrich 736465-100G) was printed on the gold electrode by ink jet printing and was burned at 180 degrees C. for 30 minutes to form a conductive convex portion. The conductive convex portion had a diameter of 50 μm and a height of 520 nm.

A fluorinated insulation layer was formed of CYTOP on the surface of the base material in the same manner as in Example 1. As a result of an evaluation made through an observation using the microscope and a measurement of a level difference, it was found that the surface of the conductive convex portion was coated with the fluorinated insulation layer and an aperture was not observed.

Example 5

A top-gate bottom contact type organic thin-film transistor was manufactured in the following procedure.

The glass of Example 1 was prepared as the base material. A metal mask having apertures in a pattern of the source electrode and the drain electrode was fixed on the surface of the base material. A gold thin-film was formed by vacuum deposition. A thickness of the gold thin-film was measured in the same manner as in Example 1, so that the thickness was 100 nm. An organic semiconductor ink was applied on the source electrode and the drain electrode by ink jet printing and dried for 10 minutes on the hot plate heated at 150 degrees C., in which the organic semiconductor ink was prepared by dissolving 1 wt % of Regioregular poly(3-hexylthiophene-2,5-diyl) (P3HT: Sigma-Aldrich 698989) in Decahydronaphthalene (manufactured by Wako Pure Chemical Industries, Ltd.).

A liquid-repellent conductive convex portion was formed in the same manner as in Example 4 at a part of the source electrode and the drain electrode, where an action of the transistor was not disturbed. Subsequently, in the same manner as in Example 4, CYTOP was applied and dried to form a gate insulation layer having a thickness of 0.4 μm. It was confirmed through an observation using the microscope that a VIA post was formed on the surface of the gate insulation layer by the effect of the liquid-repellent conductive convex portion. A metal mask having apertures in a pattern of lead lines overlapping with VIA posts respectively formed on the source electrode and the drain electrode was fixed on the base material. Gold was deposited by vacuum deposition to have a thickness of 100 nm, so that the lead lines from the source electrode and the drain electrode under the gate insulation layer were formed on the base material.

A metal mask having apertures in a pattern of the source electrode and the drain electrode was fixed on the surface of the base material. Aluminum was deposited by vacuum deposition to have a thickness of 200 nm, so that a top-gate bottom contact type organic thin-film transistor was manufactured.

A measurement probe was brought into contact with each of the lead lines respectively connected to the source electrode and the drain electrode through the VIA posts. Transistor characteristics were measured using a semiconductor parameter analyzer (B1500A manufactured by Agilent Technologies). The manufactured transistor operated normally in a manner that a current value was increased depending on a potential difference between the source electrode and the drain electrode and the increased current value was controllable by a gate voltage.

From the above, it was ascertained that the fluorinated insulation layer was penetrated by the conductive convex portion and had the aperture and electrical continuity between the layers was establishable. In other words, it was confirmed that the VIA posts of the fluorinated insulation layer was formable in a simple way.

The invention claimed is:

1. A laminated wiring member comprising:
    a wiring member comprising a base material and a first electrode formed on the base material;
    a conductor in a form of a conductive convex portion comprising a conductive material and a liquid repellent, the conductive convex portion being in electrical continuity with the first electrode, functioning as a VIA post, and having a surface energy from more than 30 mN/m to 80 mN/m, wherein the conductive material is in a form of metal particles, and the liquid repellent is a fluorine-containing compound adapted to form a self-assembled monomolecular film;
    an insulation layer formed of a resin composition and in which the conductive convex portion is present; and
    a second electrode in electrical continuity with the conductive convex portion and formed on the insulation layer, wherein
    a height of the conductive convex portion is larger than a thickness of the insulation layer, and
    at least a part of the conductive convex portion projecting from the insulation layer is in electrical continuity with the second electrode.

2. The laminated wiring member according to claim 1, wherein the fluorine-containing compound is a fluorine-containing thiol compound.

3. The laminated wiring member according to claim 1, wherein
the conductive material and the liquid repellent are exposed on a surface of the conductor.

4. The laminated wiring member according to claim 1, wherein
the conductive convex portion comprises a plurality of conductive convex portions.

5. The laminated wiring member according to claim 1, wherein
the conductive convex portion comprises a vertical cross-sectional shape that is at least one selected from the group consisting of a semicircular shape, a semi-elliptical shape, a quadrangular shape, a semicircular shape having a flat portion or a dent at a center thereof, a semi-elliptical shape having a flat portion or a dent at a center thereof, and a quadrangular shape having a flat portion or a dent at a center thereof.

6. The laminated wiring member according to claim 1, wherein
the resin composition is a fluorinated resin composition.

7. The laminated wiring member according to claim 1, wherein
the conductive convex portion comprises a height in a range from more than one time to 10 times of the thickness of the insulation layer on the first electrode.

8. The laminated wiring member according to claim 1, wherein
the conductive convex portion comprises a size in a range from 10 μm to 100 μm.

9. The laminated wiring member according to claim 1, wherein
the conductive convex portion comprises an aspect ratio that is a ratio of the height to the size, of the conductive convex portion the aspect ratio being in a range from 0.01 to 0.5.

10. A semiconductor device comprising: the laminated wiring member according to claim 1, wherein
the first electrode is a source electrode, a drain electrode or an intermediate electrode, and the second electrode is a gate electrode, an intermediate electrode or an external input/output electrode.

11. Electronic equipment comprising the laminated wiring member according to claim 1.

12. A manufacturing method of a laminated wiring member, comprising:
a first step comprising: preparing a wiring member comprising a base material and a first electrode formed on the base material; applying a conductor composition ink comprising a conductive material, a liquid repellent and a solvent on the first electrode; and burning the conductor composition ink to form a conductor in a form of a conductive convex portion being in electrical continuity with the first electrode, having liquid repellency, functioning as a VIA post, and having a surface energy from more than 30 mN/m to 80 mN/m, wherein the conductive material is in a form of metal particles, the liquid repellent is a fluorine-containing compound adapted to form a self-assembled monomolecular film;
a second step of forming a coating film of a resin composition on the wiring member where the conductive convex portion is formed and curing the coating film, thereby forming an insulation layer comprising the conductive convex portion so that a height of the conductive convex portion is larger than a thickness of the insulation layer; and
a third step of forming a second electrode on the insulation layer so that the second electrode is in electrical continuity with at least a part of the conductive convex portion projecting from the insulation layer.

13. The manufacturing method of the laminated wiring member according to claim 12, wherein
the fluorine-containing compound is a fluorine-containing thiol compound.

14. The manufacturing method of the laminated wiring member according to claim 12, wherein
the conductor composition ink is subjected to a burning temperature in a range from 120 degrees C. to 200 degrees C. in the first step.

15. The manufacturing method of the laminated wiring member according to claim 12, wherein
the resin composition is a fluorinated resin composition.

16. The manufacturing method of the laminated wiring member according to claim 12, wherein
the insulation layer is formed in the second step so that the height of the conductive convex portion is in a range from more than one time to 10 times of the thickness of the insulation layer on the first electrode.

17. The manufacturing method of the laminated wiring member according to claim 12, wherein
the conductive convex portion is formed in the first step so that a size of the conductive convex portion is in a range from 10 μm to 100 μm.

18. The manufacturing method of the laminated wiring member according to claim 12, wherein
the conductive convex portion is formed in the first step so that an aspect ratio, that is a ratio of the height to the size, of the conductive convex portion is in a range from 0.01 to 0.5.

19. The manufacturing method of the laminated wiring member according to claim 12, wherein
the resin composition comprises a viscosity at 25 degrees C. in a range from 20 mPa·s to 500 mPa·s.

20. The manufacturing method of the laminated wiring member according to claim 12, wherein
the resin composition comprises a surface energy in a range from 20 mN/m to 50 mN/m.

21. A conductor composition ink used in the manufacturing method of the laminated wiring member according to claim 12, the conductor composition ink comprising:
a conductive material, a liquid repellent and a solvent, wherein
the conductive material is in a form of metal particles,
the liquid repellent is a fluorine-containing thiol compound adapted to form a self-assembled monomolecular film, and
a surface energy of a solidified film obtained by heating the conductor composition ink at 180 degrees C. for 30 minutes is in a range from more than 30 mN/m to 80 mN/m.

* * * * *